(12) United States Patent
Wittenberg et al.

(10) Patent No.: US 11,963,425 B1
(45) Date of Patent: Apr. 16, 2024

(54) ELECTRONIC DEVICES HAVING DISPLAYS WITH CURVED SURFACES

(71) Applicant: Apple Inc., Cupertino, CA (US)

(72) Inventors: Michael B. Wittenberg, San Francisco, CA (US); Jean-Pierre S. Guillou, Los Gatos, CA (US); Tyler R. Kakuda, San Francisco, CA (US); Christopher D. Prest, San Francisco, CA (US); Marwan Rammah, San Francisco, CA (US); Rasamy Phouthavong, San Jose, CA (US); Richard H. Dinh, Saratoga, CA (US); David A. Pakula, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 229 days.

(21) Appl. No.: 17/224,020

(22) Filed: Apr. 6, 2021

Related U.S. Application Data

(63) Continuation of application No. 16/505,559, filed on Jul. 8, 2019, now abandoned.
(Continued)

(51) Int. Cl.
*H10K 59/50* (2023.01)
*G06F 1/16* (2006.01)
(Continued)

(52) U.S. Cl.
CPC ........... *H10K 59/50* (2023.02); *G06F 1/1652* (2013.01); *G06F 3/044* (2013.01); *H04M 1/026* (2013.01);
(Continued)

(58) Field of Classification Search
CPC ......... H04L 27/32; H04L 51/10; H04L 51/52; H04L 27/3244; H04L 27/323;
(Continued)

(56) References Cited

U.S. PATENT DOCUMENTS 28,341 A 5/1860 Bennett
4,349,817 A 9/1982 Hoffman et al.
(Continued)

FOREIGN PATENT DOCUMENTS

KR 20180034832 A 4/2018

OTHER PUBLICATIONS

Portable Display Device; WO 2011136516 A2 (Year: 2011).*
(Continued)

*Primary Examiner* — Meless N Zewdu
(74) *Attorney, Agent, or Firm* — Treyz Law Group, P.C.; G. Victor Treyz; David K. Cole

(57) ABSTRACT

An electronic device may have a display overlapped by a cover layer. Portions of the surface of the display and cover layer may have curved profiles. The display may include a flexible substrate and may have bent edge portions protruding from a central region. Gaps may be formed between regions of pixels on a common substrate or between separate display panels. Gap-overlapping structures may overlap the gaps to hide internal components from view or to blend the appearance of gaps with the appearance of adjoining portions of a display layer. The gap-overlapping structures may include light sources such as crystalline semiconductor light-emitting diodes. The diodes may emit light through light diffusing structures. Protruding display layer fingers and other structures may be used to accommodate display cover layer surfaces with curved profiles such as corner surfaces of compound curvature.

27 Claims, 23 Drawing Sheets

Related U.S. Application Data

(60) Provisional application No. 62/696,298, filed on Jul. 10, 2018.

(51) Int. Cl.

| | | |
|---|---|---|
| *G06F 3/044* | (2006.01) | |
| *H04M 1/02* | (2006.01) | |
| *H04W 88/02* | (2009.01) | |
| *H10K 50/854* | (2023.01) | |
| *H10K 50/858* | (2023.01) | |
| *H10K 59/12* | (2023.01) | |
| *H10K 59/40* | (2023.01) | |
| *H10K 77/10* | (2023.01) | |
| *H10K 102/00* | (2023.01) | |

(52) U.S. Cl.
CPC ....... *H04M 1/0266* (2013.01); *H04M 1/0268* (2013.01); *H04M 1/0269* (2022.02); *H04W 88/02* (2013.01); *H10K 50/854* (2023.02); *H10K 50/858* (2023.02); *H10K 59/12* (2023.02); *H10K 59/40* (2023.02); *H10K 77/111* (2023.02); *G06F 2203/04102* (2013.01); *H04M 2201/38* (2013.01); *H10K 2102/311* (2023.02)

(58) Field of Classification Search
CPC ............. H04L 51/5268; H04L 51/0097; H04L 51/5275; H04L 51/323; H04L 2251/5338; H04M 1/02; H04M 1/0202; H04M 1/0268; H04M 2201/38; H04M 2250/00; H04M 2250/16; H04M 1/26; H04M 1/0266; H04M 2201/02; H04M 1/026; H04M 1/0269; H04M 3/436; H04M 1/66; H04M 7/0078; H04M 15/47; G06F 3/044; G06F 2203/04102; G06F 3/041; G06F 3/0412; G06F 3/147; G06F 2203/04802; G06F 1/16; G06F 1/3218; G06F 1/1601; G06F 1/1637; G06F 1/1652; G06F 1/1622; H04W 92/08; H04W 88/00; H04W 88/02; H04W 52/027; H01L 27/00; H01L 27/04; H01L 51/00; H10K 59/50; H10K 50/854; H10K 50/858; H10K 59/12; H10K 59/40; H10K 77/111; H10K 2102/311; H10K 77/10; H10K 59/30; H10K 59/10; G09G 2300/02; G09G 2300/023; G09G 2380/02
See application file for complete search history.

(56) References Cited

U.S. PATENT DOCUMENTS

| | | | |
|---|---|---|---|
| 4,534,813 A | | 8/1985 | Williamson et al. |
| 5,329,386 A | | 7/1994 | Birecki et al. |
| 5,502,457 A | | 3/1996 | Sakai et al. |
| 5,659,378 A | | 8/1997 | Gessel |
| 6,046,730 A | | 4/2000 | Bowen et al. |
| 6,407,785 B1 | | 6/2002 | Yamazaki |
| 6,467,922 B1 | | 10/2002 | Blanc et al. |
| 6,680,761 B1 | | 1/2004 | Greene et al. |
| 6,845,190 B1 | | 1/2005 | Smithwick et al. |
| 7,228,051 B2 | | 6/2007 | Cok et al. |
| 7,542,209 B2 | | 6/2009 | McGuire, Jr. |
| 7,823,309 B2 | | 11/2010 | Albenda |
| 7,856,161 B2 | | 12/2010 | Tabor |
| 8,045,270 B2 | | 10/2011 | Shin et al. |
| 8,723,824 B2* | | 5/2014 | Myers et al. ............. 345/173 |
| 8,766,882 B2 | | 7/2014 | Fukushima et al. |
| 8,824,779 B1 | | 9/2014 | Smyth |
| 8,976,141 B2* | | 3/2015 | Myers et al. ......... G06F 1/1652 |
| 8,976,324 B2 | | 3/2015 | Yang et al. |
| 9,098,242 B2* | | 8/2015 | Rappoport et al. ... G06F 1/1656 |
| 9,268,068 B2 | | 2/2016 | Lee |
| 9,312,517 B2 | | 4/2016 | Drzaic et al. |
| 9,342,105 B2 | | 5/2016 | Choi et al. |
| 9,509,939 B2 | | 11/2016 | Henion et al. |
| 9,591,765 B2 | | 3/2017 | Kim et al. |
| 9,755,004 B2 | | 9/2017 | Shieh et al. |
| 9,818,725 B2 | | 11/2017 | Bower et al. |
| 9,907,193 B2 | | 2/2018 | Lee et al. |
| 10,020,462 B1* | | 7/2018 | Ai et al. ................. H01L 51/524 |
| 10,048,532 B2 | | 8/2018 | Powell et al. |
| 10,052,831 B2 | | 8/2018 | Welker et al. |
| 10,055,039 B2 | | 8/2018 | Myers et al. |
| 10,088,863 B2 | | 10/2018 | Rappoport et al. |
| 10,509,439 B2* | | 12/2019 | Choi et al. ............ G06F 1/1652 |
| 2006/0016448 A1 | | 1/2006 | Ho |
| 2007/0097108 A1 | | 5/2007 | Brewer |
| 2008/0144174 A1 | | 6/2008 | Lucente et al. |
| 2008/0186252 A1 | | 8/2008 | Li |
| 2010/0177261 A1 | | 7/2010 | Jin et al. |
| 2010/0238090 A1 | | 9/2010 | Pomerantz et al. |
| 2010/0253883 A1 | | 10/2010 | Tomizuka |
| 2011/0025594 A1 | | 2/2011 | Watanabe |
| 2011/0057861 A1 | | 3/2011 | Cok et al. |
| 2011/0102300 A1 | | 5/2011 | Wood et al. |
| 2011/0242686 A1 | | 10/2011 | Watanabe |
| 2012/0218219 A1 | | 8/2012 | Rappoport et al. |
| 2012/0236483 A1* | | 9/2012 | Watanabe ................. 361/79.01 |
| 2013/0081756 A1* | | 4/2013 | Franklin et al. ............. 156/221 |
| 2013/0083080 A1 | | 4/2013 | Rappoport et al. |
| 2013/0235560 A1 | | 9/2013 | Etienne et al. |
| 2013/0279088 A1 | | 10/2013 | Raff et al. |
| 2014/0037257 A1 | | 2/2014 | Yang et al. |
| 2014/0042406 A1 | | 2/2014 | Degner et al. |
| 2014/0043370 A1 | | 2/2014 | Payne et al. |
| 2014/0092028 A1 | | 4/2014 | Prest et al. |
| 2014/0092346 A1 | | 4/2014 | Yang et al. |
| 2014/0104762 A1* | | 4/2014 | Park ...................... H05K 5/0017 |
| 2014/0140037 A1* | | 5/2014 | Cho ........................ F21V 21/14 |
| 2014/0183473 A1 | | 7/2014 | Lee et al. |
| 2014/0240289 A1* | | 8/2014 | Myers et al. .......... G06F 1/1652 |
| 2014/0240985 A1 | | 8/2014 | Kim et al. |
| 2014/0328041 A1 | | 11/2014 | Rothkopf et al. |
| 2014/0354920 A1 | | 12/2014 | Jang et al. |
| 2015/0093087 A1 | | 4/2015 | Wu |
| 2015/0227227 A1 | | 8/2015 | Myers et al. |
| 2015/0285467 A1* | | 10/2015 | Choi et al. ............. F21V 13/12 |
| 2016/0001521 A1* | | 1/2016 | Tanaka et al. ............ B32B 3/28 |
| 2016/0005789 A1 | | 1/2016 | Rhee |
| 2016/0093683 A1 | | 3/2016 | Lee et al. |
| 2016/0231783 A1* | | 8/2016 | Raff et al. ............. G06F 1/1652 |
| 2016/0231784 A1 | | 8/2016 | Yu et al. |
| 2016/0234362 A1 | | 8/2016 | Moon et al. |
| 2016/0270209 A1 | | 9/2016 | Cho |
| 2016/0275719 A1* | | 9/2016 | Oke ....................... G06T 17/005 |
| 2017/0005116 A1 | | 1/2017 | Ambekar et al. |
| 2017/0038641 A1* | | 2/2017 | Yamazaki ......... G02F 1/133555 |
| 2017/0059926 A1 | | 3/2017 | Kim |
| 2017/0126865 A1* | | 5/2017 | Lee ...................... H04M 1/0266 |
| 2017/0192291 A1 | | 7/2017 | Shi |
| 2017/0228002 A1 | | 8/2017 | Yamazaki et al. |
| 2017/0235341 A1 | | 8/2017 | Huitema et al. |
| 2018/0033848 A1 | | 2/2018 | Jung et al. |
| 2018/0052312 A1 | | 2/2018 | Jia et al. |
| 2018/0088416 A1 | | 3/2018 | Jiang et al. |
| 2018/0114942 A1 | | 4/2018 | Chida |
| 2018/0143490 A1* | | 5/2018 | Wakabayashi .... G06F 1/133526 |
| 2018/0144675 A1* | | 5/2018 | Lee et al. ................ G09G 3/2003 |
| 2018/0156965 A1 | | 6/2018 | El-Ghoroury et al. |
| 2018/0184531 A1* | | 6/2018 | Sea et al. ............. H05K 5/0017 |
| 2018/0203279 A1 | | 7/2018 | Zhou et al. |
| 2018/0231789 A1 | | 8/2018 | Ng et al. |
| 2018/0372958 A1 | | 12/2018 | Karafin et al. |
| 2019/0018529 A1 | | 1/2019 | Kudo et al. |
| 2019/0073505 A1 | | 3/2019 | Kwon et al. |
| 2019/0140043 A1 | | 5/2019 | Wang et al. |
| 2019/0147214 A1 | | 5/2019 | Lee et al. |
| 2019/0220121 A1 | | 7/2019 | Kim et al. |
| 2019/0221176 A1 | | 7/2019 | Emslie |

(56) References Cited

U.S. PATENT DOCUMENTS

2019/0363290 A1  11/2019  Watanabe
2019/0392786 A1  12/2019  Chida
2020/0043989 A1   2/2020  Liu et al.

OTHER PUBLICATIONS

Electro-Optical Device and Electronic Apparatus; JP 2010139862 A (Year: 2010).*
Liquid Crystal Display Device Comprising Backlight Light Source Panel; EP 3343277 A2 (Year: 2018).*
Masahiro (JP 2760915 B2) >>> Image Display Device (see title). (Year: 1998).*
Xu, Huan (WO 2018192045 A1) >>> Flexible Display Panel Attachment Device and Attachment Method Therefor (see title). (Year: 2018).*

* cited by examiner

ELECTRONIC DEVICES HAVING DISPLAYS WITH CURVED SURFACES This application is a continuation of U.S. patent application Ser. No. 16/505,559, filed Jul. 8, 2019, which claims the benefit of provisional patent application No. 62/696,298, filed Jul. 10, 2018, which are hereby incorporated by reference herein in their entireties.

FIELD

This relates generally to electronic devices, and, more particularly, to electronic devices with displays.

BACKGROUND

Electronic devices such as cellular telephones, tablet computers, and other electronic equipment may include displays for presenting images to a user.

If care is not taken, electronic devices with displays may not have a desired appearance or may be difficult to use satisfactorily. For example, displays may be bulky and unattractive or may not accommodate a desired electronic device shape.

SUMMARY

An electronic device may have a display overlapped by a display cover layer. Portions of the surface of the display and cover layer may have curved profiles. For example, a display cover layer may have transparent sidewall portions with curved surface profiles. The transparent sidewall portions of the display cover layer may include rounded corners having areas of compound curvature.

The display of the electronic device may include a flexible substrate. For example, the display may include a flexible display layer such as an organic light-emitting diode display layer with an array of pixels configured to display images for a user. The display layer may have bent edge portions protruding from a central region and other protrusions and may be configured to overlap surfaces on a front face, a rear face, and/or sidewalls of an electronic device.

Gaps may be formed between regions of pixels on a common substrate or between separate display panels forming a display. Gap-overlapping structures may overlap the gaps to hide internal components from view or to blend the appearance of gaps with the appearance of adjoining portions of a display layer.

The gap-overlapping structures may include light sources such as crystalline semiconductor light-emitting diodes. The diodes may emit light through light diffusing structures. Protruding display layer fingers and other structures may be used to accommodate display cover layer surfaces with curved surface profiles such as surfaces in the rounded corners or other areas of compound curvature.

DETAILED DESCRIPTION

Electronic devices may be provided with displays. The displays may have planar surfaces and curved surfaces. For example, a display may have a planar central portion surrounded by bent edges. The bent edges may have curved surface profiles. Arrangements in which displays exhibit compound curvature may also be used. Electronic devices having displays with curved surfaces may have an attractive appearance, may allow the displays to be viewed from a variety of different angles, and may include displays with a borderless or nearly borderless configuration.

Figure 1:
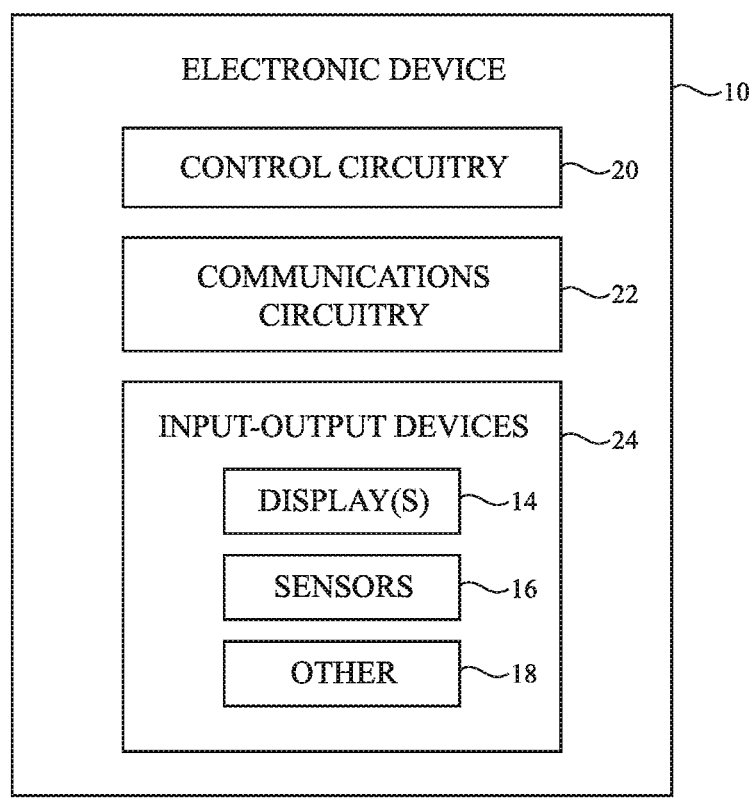
FIG. 1 is a schematic diagram of an illustrative electronic device in accordance with an embodiment.

A schematic diagram of an illustrative electronic device having a display with curved surface portions is shown in FIG. 1. Device 10 may be a cellular telephone, a tablet computer, a laptop computer, a wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link) Wireless communications may, for example, be supported over a Bluetooth® link, a WiFi® link, a 60 GHz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. During operation, control circuitry 20 may use sensors and other input devices in devices 24 to gather input and can control output devices in devices 24 to provide desired output.

Devices 24 may include one or more displays such as display(s) 14. An output device such as display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 18 in input-output devices 24). The additional components may include haptic output devices, audio output devices such as speakers, light producing output devices such as light-emitting diodes for status indicators, light sources such as light-emitting diodes (e.g., crystalline semiconductor light-emitting diodes) that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
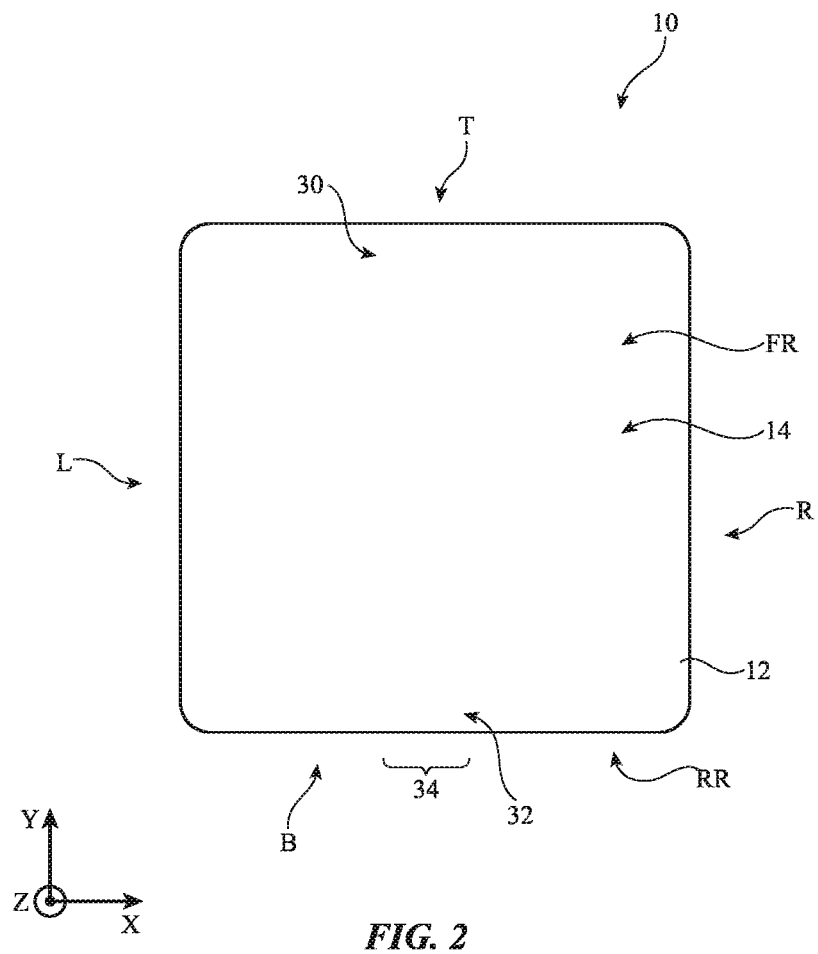
FIG. 2 is a top view of an illustrative electronic device in accordance with an embodiment.

FIG. 2 is a front (plan) view of electronic device 10 in an illustrative configuration in which display 14 covers some or all of the front face FR of device 10. Opposing rear face RR of device 10 may be covered by a housing wall formed from glass, metal, polymer, and/or other materials. Rear face RR may be free of display pixels and/or may be partly or fully covered by display 14.

Device 10 may include a housing (e.g., housing 12) that forms sidewall structures for device 10 and/or internal supporting structures (e.g., a frame, midplate member, etc.). In some illustrative arrangements, sidewall portions of device 10 may be covered with portions of display 14. In the example of FIG. 2, device 10 is characterized by four peripheral edges: upper edge T, lower edge B, left edge L, and right edge R. Upper edge T and opposing lower edge B may run parallel to each other and parallel to the X axis of FIG. 2. Left edge L and opposing right edge R may run parallel to each other and parallel to the Y axis of FIG. 2. Front face FR and rear face RR may be planar (e.g., two parallel planes offset by a distance along the Z axis) and/or may include curved portions.

Touch sensor circuitry such as two-dimensional capacitive touch sensor circuitry may be incorporated into one or more display panels in device 10 as separate touch sensor panels overlapping display pixels or may be formed as part of one or more display panels in device 10. Touch sensors may be formed on front face FR, rear face RR, and/or edges (sidewall faces) T, B, R, and/or L. If desired, icons and other images for virtual buttons may be displayed by the pixels of device. For example, virtual buttons and/or other images may be displayed on front face FR, rear face RR, and/or sidewall structures in device 10 such as edges T, B, R, and/or L and may overlap touch sensor circuitry. Haptic output devices may be used to provide haptic feedback when virtual buttons are selected (as an example).

Device 10 of FIG. 2 has a rectangular outline with four rounded corners. If desired, device 10 may have other shapes. For example, device 10 may have a shape that folds and unfolds along a bend (folding) axis and may include a display that overlaps or that does not overlap the bend axis, may have a shape with an oval footprint or circular outline, may have a cubic shape, may have a pyramidal, cylindrical, or conical shape, or may have other suitable shapes. The configuration of FIG. 2 is illustrative.

If desired, openings may be formed in the surfaces of device 10. For example, a speaker port and optical windows for an ambient light sensor, an infrared proximity sensor, and a depth sensor may be formed in a region such as upper region 30 of front face FR. A finger print sensor, touch sensor button, force-sensitive button, or other sensor that operates through display 14 may be formed under the portion of display in lower region 32 on front face FR and/or other portions of front face FR and/or other external surfaces of device 10. An optional opening for a connector (e.g., a digital data connector, analog signal connector, and/or power connector) may be formed in portion 34 of the lower sidewall of device 10 running along lower edge B. This opening may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

Figure 3:
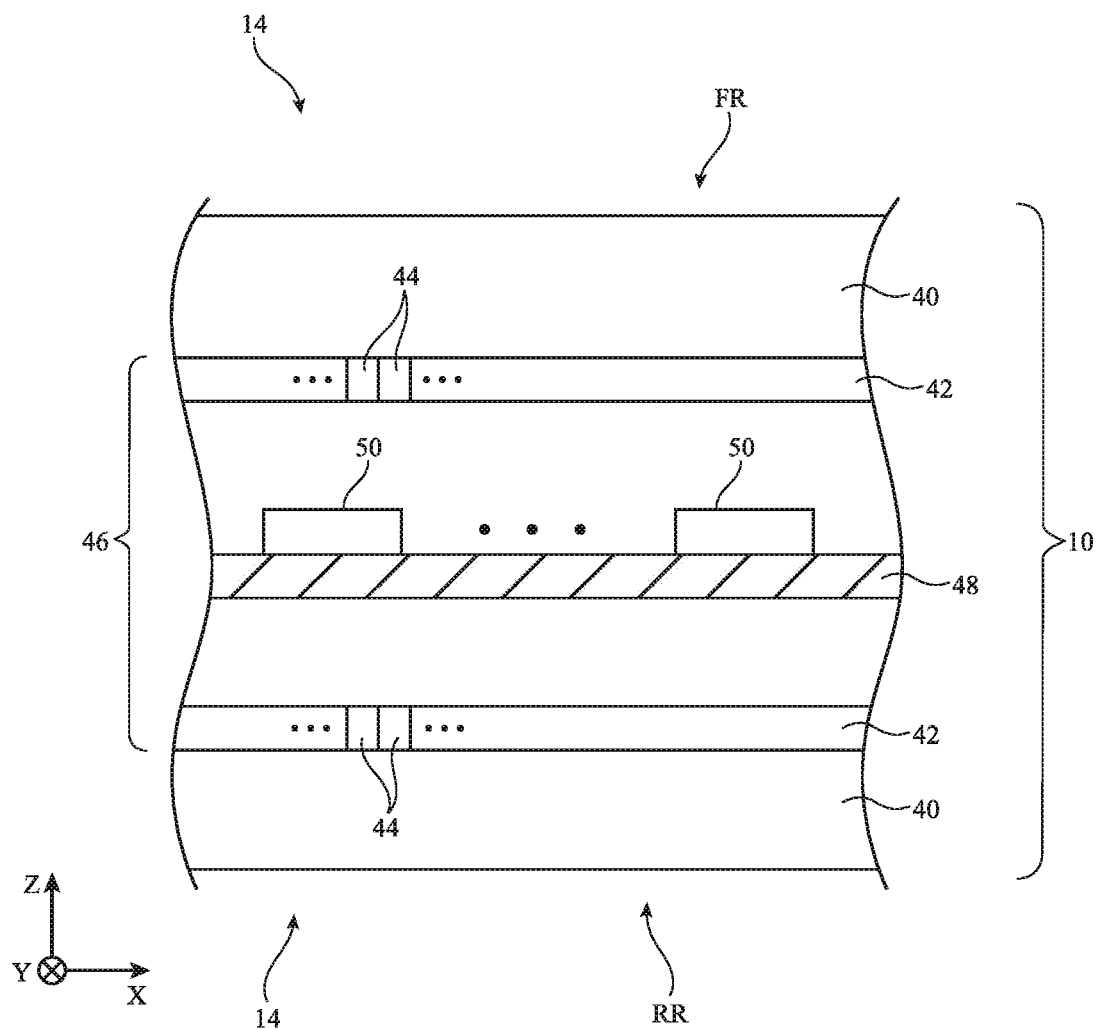
FIG. 3 is a cross-sectional side view of an illustrative electronic device in accordance with an embodiment.

FIG. 3 is a cross-sectional side view of an illustrative electronic device. As shown in FIG. 3, display 14 may be formed on front face FR and/or rear face RR of device 10. Display 14 may include one or more transparent protective layers such as display cover layer 40. Display cover layer 40 may be formed from transparent material such as clear glass, polymer, sapphire or other crystalline material, or other transparent material. Display layers such as layers 42 may have arrays of pixels 44 that form images. The pixel arrays (e.g., layers 42) may sometimes be referred to as pixel layers, pixel array layers, displays, display structures, display layers, or display panels. For example, layers 42 may be formed from organic light-emitting diode displays. In the example of FIG. 3, device 10 has a first display 14 (or first display portion of a display panel or other display structure) formed from a first pixel array 42 on front face FR. This first pixel array is visible in the —Z direction through display cover layer 40 on front face FR. Device 10 of FIG. 3 also has a second display 14 (or second display portion of the display panel or other display structure) formed from a second pixel array 42 on rear face RF. This second pixel array is visible in the +Z direction through display cover layer 40 on rear face RR. The front and/or rear surfaces formed by display cover layer(s) 40 may be planar (as shown in FIG. 3) or may have a curved profile.

If desired, the second display 14 of device 10 may be omitted. For example, pixel array 42 on rear face RR may be omitted. In this configuration, the inner surface of layer 40 on rear face RR may be coated with a black masking material or other opaque coating and/or may be coated with colored and/or shiny structures. Coating material can be patterned to form logos, text, and other visual elements. This type of arrangement may be used to hide internal components in interior 46 of device from view from the exterior of device 10. As shown in FIG. 3, for example, device 10 may include electrical components 50 in interior 46 (e.g., integrated circuits, sensors and other input-output devices, control circuitry, display layers 42 such as organic light-emitting diode panels or other display layers, etc.). Electrical components 50 may, if desired, be mounted on printed circuits such as printed circuit 48 (e.g., flexible printed circuits and/or printed circuits formed from rigid printed circuit board material). In configurations such as these in which the lower pixel array of device 10 is omitted, the portion of device 10 on rear face RR (e.g., layer 40) may be formed from metal (e.g., a stainless steel or aluminum layer). For example, device 10 may have a rear housing wall formed from metal. Device 10 may also have housing walls formed from opaque glass, transparent glass coated with opaque materials such as ink or metal, and/or other housing wall materials.

In some configurations for device 10, an opaque material such as metal or opaque polymer may form some or all of the sidewalls of device 10. As an example, metal that forms some or all of a rear housing wall on rear face RR of device 10 may protrude upwardly along the edges of device 10 to form some or all of the sidewalls for device 10. As another example, a peripheral metal band that forms some or all of the sidewalls of device 10 may extend around the rectangular periphery of device 10 (e.g., along upper edge T, right edge R, lower edge B, and left edge L). Sidewalls may have vertically extending planar surfaces and/or may exhibit other surface profiles (e.g., curved profiles).

If desired, some or all of the sidewalls of device 10 may be formed from clear material and may overlap light-producing components. This material may, as an example, be part of display cover layers 40 of FIG. 3 (e.g., an extending piece of glass, polymer, crystalline material, or other transparent display cover layer material). Because clear layers of glass, plastic, crystalline material, and/or other clear layers of material in device 10 may enclose and protect internal device components, these outer layers of material in device 10 serve as an enclosure (housing 12) for device 10.

In configurations for device 10 in which sidewalls have transparent portions formed from extending portions of display cover layers 40 or other transparent material, the sidewalls may overlap light-emitting components. Transparent sidewalls may have planar and/or curved surfaces and may be formed from clear glass, clear polymer, transparent crystalline material such as sapphire, and/or other transparent protective material. Displays (pixel arrays), light-emitting diodes covered with diffusing material, light-emitting diodes covered with patterned masks (e.g., opaque coatings with icon-shaped openings or openings of other shapes), and/or other light-emitting devices may be placed under clear sidewalls.

During operation, light emitted from the pixels or other light-emitting components under the sidewalls may pass through the sidewalls. In arrangements in which display panels are placed under transparent sidewalls, images may be displayed through the sidewalls. The images may form parts of images being displayed on front face FR and/or rear face RR and/or may be separate images. For example, a photograph may extend across front face FR and some or all of the sidewalls of device 10 and/or a photograph may cover only front face FR while virtual buttons are displayed on the sidewalls of device 10. In arrangements in which one or more light-emitting diodes and an overlapping diffuser are placed under transparent sidewalls, diffuse light may be emitted through the sidewalls.

In addition to optional opaque housing structures such as metal housing walls or opaque walls formed from other materials, device 10 may include display cover layers 40 and other structures formed from transparent glass, transparent polymer, and/or other transparent material. These materials may surround the interior of device 10 and thereby serve as a housing for device 10 as well as serving as protective layers for pixel arrays and other light-emitting components. In the example of FIG. 3, the front surface of device 10 is formed by a planar surface of display cover layer 40 on front face FR and the rear surface of device 10 is formed by a planar surface of display cover layer 40 on rear face RR. In general, device 10 may have planar surface portions and/or curved surface portions (surface portions with curved profiles) and these portions may be formed by display cover layers, other layers formed from glass, polymer, sapphire or other crystalline material, ceramic, or other potentially transparent materials, metal, wood, or other materials.

Figure 4:
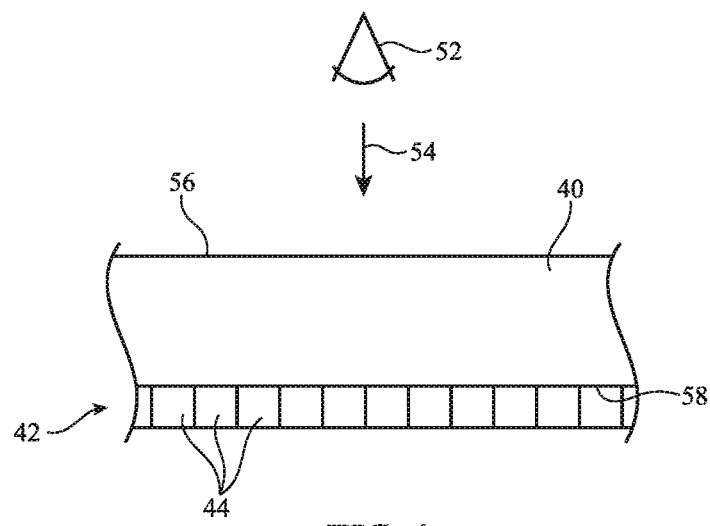
FIG. 4 is a cross-sectional side view of an illustrative planar portion of a display cover layer and pixel array in accordance with an embodiment.
Figure 5:
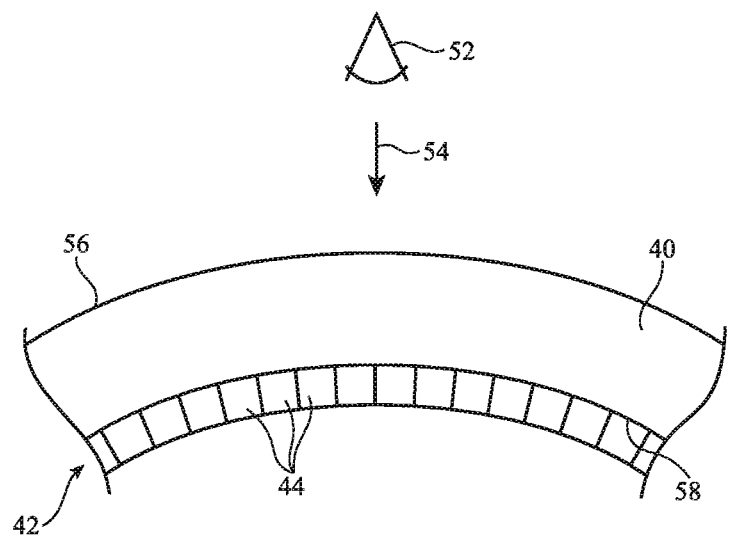
FIG. 5 is a cross-sectional side view of an illustrative curved portion of a display cover layer and pixel array in accordance with an embodiment.

Transparent portions of device 10 may overlap pixels or other light-emitting components that emit light that is visible to a user. In the illustrative arrangements of FIGS. 4 and 5, an array of pixels 44 in layer 42 is configured to emit light that passes through display cover layer 40 for viewing by viewer 52 (e.g., in direction 54 and/or other directions from the exterior of device 10). The inner and outer surface of layers 40 (and other layers enclosing the interior of device 10) may be planar and/or curved. In the illustrative configuration of FIG. 4, outer surface 56 of layer 40 and inner surface 58 of layer 40 are planar. Inner surface 58 of FIG. 4 may be curved or partly planar and partly curved, if desired. In the illustrative configuration of FIG. 5, outer surface 56 of layer 40 is curved and inner surface 58 of layer 40 is curved. Inner surface 58 may, if desired, be planar or may have planar and curved surface profile portions.

Figure 6:
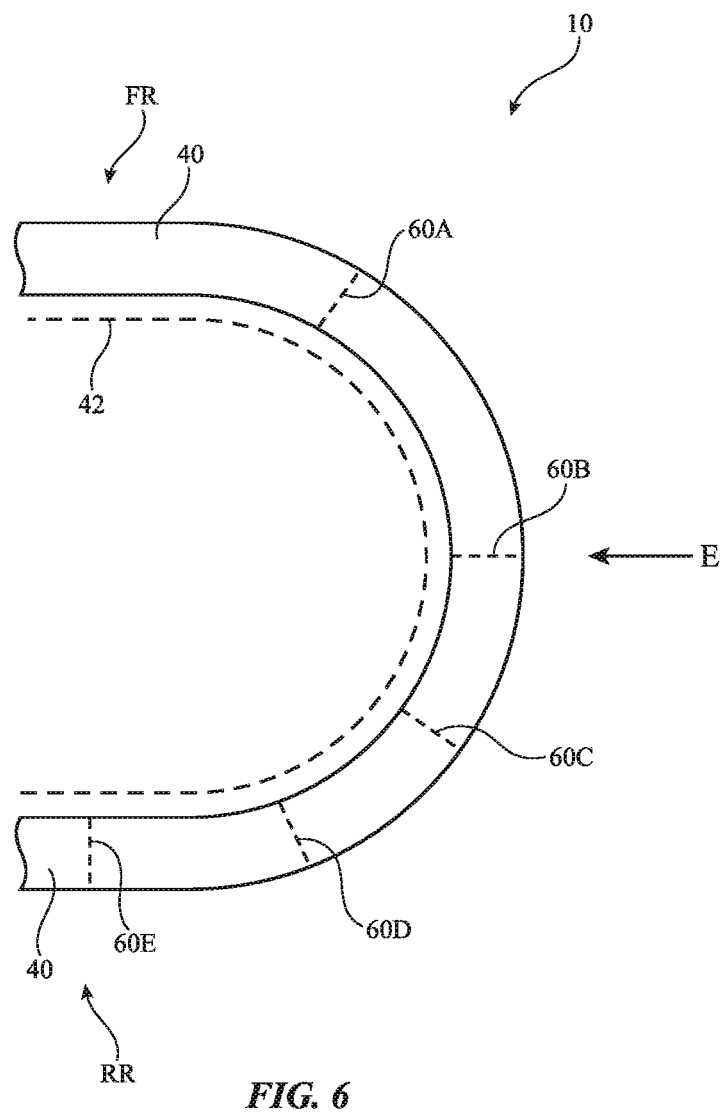
FIG. 6 is a cross-sectional side view of an illustrative sidewall portion of an electronic device in accordance with an embodiment.

Device 10 may have upper and/or lower surfaces (e.g., external surfaces 56 on front face FR and rear face RR, respectively) that are planar and/or curved. The edges of device 10 may have sidewalls with planar and/or curved portions (e.g., surfaces with straight and/or curved profiles). As shown in FIG. 6, for example, the sidewalls of device 10 along one or more edges such as edge E of device 10 (e.g., left edge L, right edge R, upper edge T, lower edge B, and/or the corners of device 10) may have a curved outer surface.

Edge E may be transparent (e.g., the entire sidewall of device 10 may be transparent and may be formed from extended portions of upper and lower display cover layer(s)) and/or one or more portions of the curved sidewall of edge E may be opaque (e.g., formed from glass or other material that is coated with opaque material, formed from opaque polymer, formed from metal, and/or formed from other opaque structures). Opaque structures (e.g., metal housing wall portions) may extend along one or more portions of edge E (e.g., metal or other opaque material may form the portion of edge E between locations 60A and 60B, between locations 60B and 60C, between locations 60C and 60D, between locations 60D and 60E, between locations 60A and 60C, between locations 60B and 60D, between locations 60C and 60E, or between other suitable locations on edge E. There may be a single strip of metal housing material that runs around all four peripheral edges E of device 10, there may be a pair of discrete strips of metal housing material that run around all four peripheral edges E in parallel, there may be no non-glass structures on edges E, and/or there may be other suitable structures on edges E.

Display layer 42 may be formed from a single panel (e.g., a single flexible organic light-emitting diode display panel having a polyimide substrate or other flexible substrate with bent edge portions), may be formed from multiple panels (e.g., multiple panels separated from one or more gaps), may be formed from panels with slots and other openings, and/or may be formed from other types of displays. Portions of display layer 42 (e.g., all of layer 42 and/or the pixels and/or other structures of layer 42) may be omitted wherever layer 42 is overlapped by a metal portion of edge E and/or other opaque structures in edge E. For example, edge E may be formed from glass everywhere except between locations 60B and 60D. The portion of edge (sidewall) E between locations 60B and 60D may be formed from metal (as an example). In this type of scenario, no display layer 42 (or at least no pixels 44) may be overlapped by the metal and pixels 44 and display layer 42 may be present under the glass portions of edge E and/or display cover layer 40 on front face FR and/or rear face RR.

Figure 7:
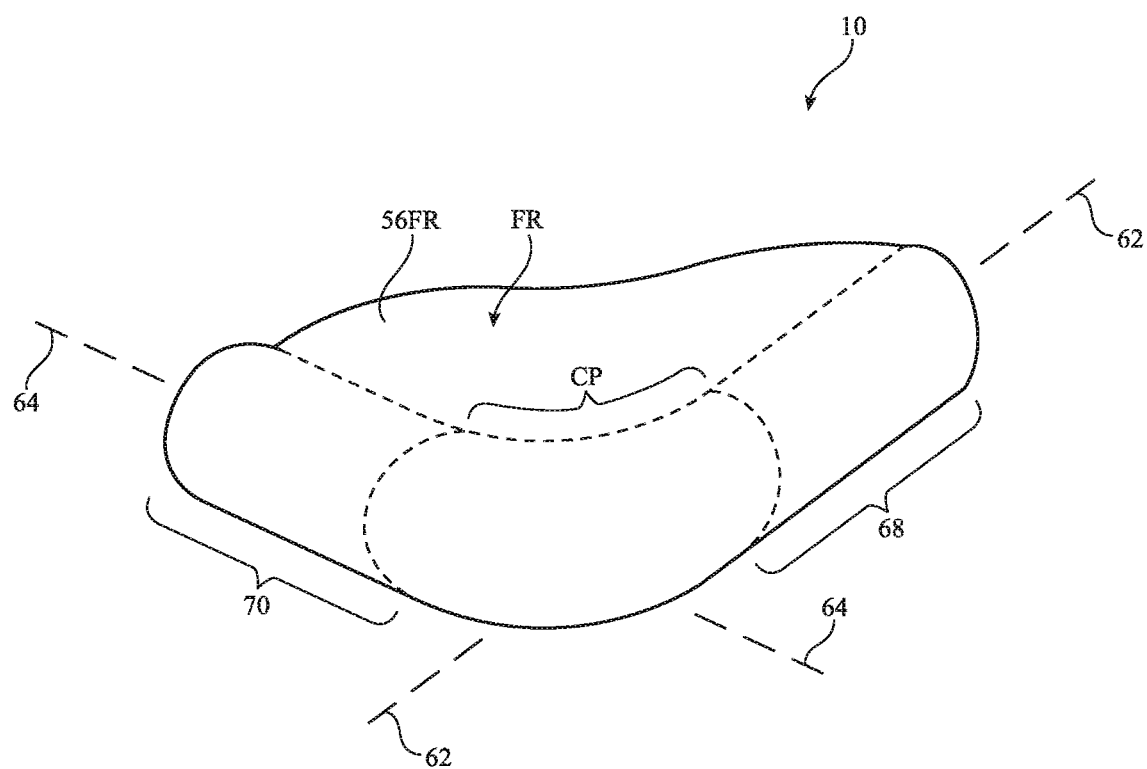
FIG. 7 is a perspective view of an illustrative corner portion of an electronic device in accordance with an embodiment.

If desired, device 10 may have external surfaces with compound curvature. A perspective view of an illustrative corner portion of device 10 is shown in FIG. 7. In the example of FIG. 7, device 10 has edge portions (sidewalls) 68 and 70 with surfaces that curve about axes 62 and 64, respectively. These portions extend along the straight sides of device 10 and are characterized by curved surfaces that can be flattened into a plane without distortion (sometimes referred to as developable surfaces). At the corner of device 10, device 10 has curved surface portions CP with compound curvature (e.g., a surface that can only be flattened into a plane with distortion, sometimes referred to as a surface with Gaussian curvature). Each of the four corners of device 10 may have this arrangement, if desired.

Flexible displays such as organic light-emitting diode displays with flexible polyimide substrates or other bendable polymer substrates can be bent about axes such as axes 62 and 64 to form curved surfaces in portions 68 and 70. In compound curvature regions such as corner regions of device 10, display 14 can be formed from materials that stretch (e.g., displays formed from mesh-shaped elastomeric substrate material), may be formed from flexible displays that are patterned to create flexible strips and other structures that can be bent to cover at least part of the compound curvature regions, and/or may use optical structures (e.g., lenses, etc.) to redirect light emitted from pixels in a display to surfaces with compound curvature.

Figure 8:
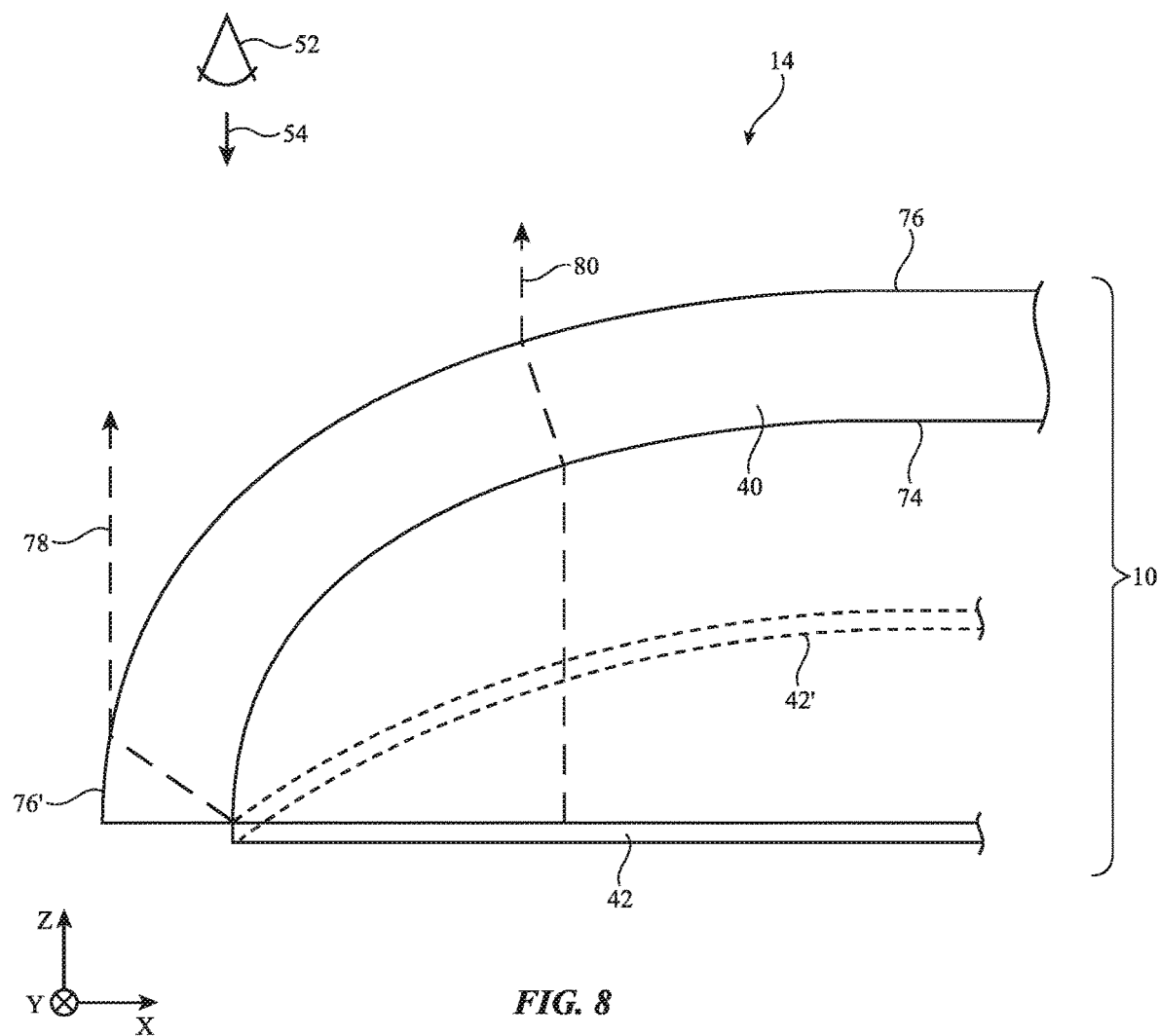
FIG. 8 is a cross-sectional side view of an edge portion of an illustrative electronic device having a display cover layer with a curved surface in accordance with an embodiment.

In some configurations, display cover layer 40 and display layer 42 may be configured to minimize the apparent border of display 14. Consider, as an example, the portion of device 10 in FIG. 8. As shown in FIG. 8, display cover layer 40 may have curved inner surface 74 and curved outer surface 76. Display layer 42 may be planar or may be curved (see, e.g., illustrative display layer 42'). If desired, display layer 42 may be mounted against the inner surface 74 of display cover layer 40.

Light from pixels near the center of display 14 may pass to viewer 52 with minimal refraction, as indicated by illustrative light ray 80 from display layer 42. Light from pixels near the edge of display layer 42 may refract more strongly upon passing through layer 40 due to the angled orientation of cover layer 40 near the edge of device 10. For example, outer surface 76 of display cover layer 40 may be sufficiently curved at the edge of device 10 (see, e.g., vertical edge portion 76') to cause ray 78 from a pixel at the end of the active area of display layer 44 to refract towards viewer 52 at the outermost or nearly outermost portion of display cover layer 40. This may make display 14 appear to be borderless or nearly borderless to viewer (user) 52 when display 14 is viewed in direction 54. Light refracting arrangements of the type shown in FIG. 8 may also be used to display images using portions of display cover layer that have curved surface profiles (e.g., surfaces of compound curvature).

Figure 9:
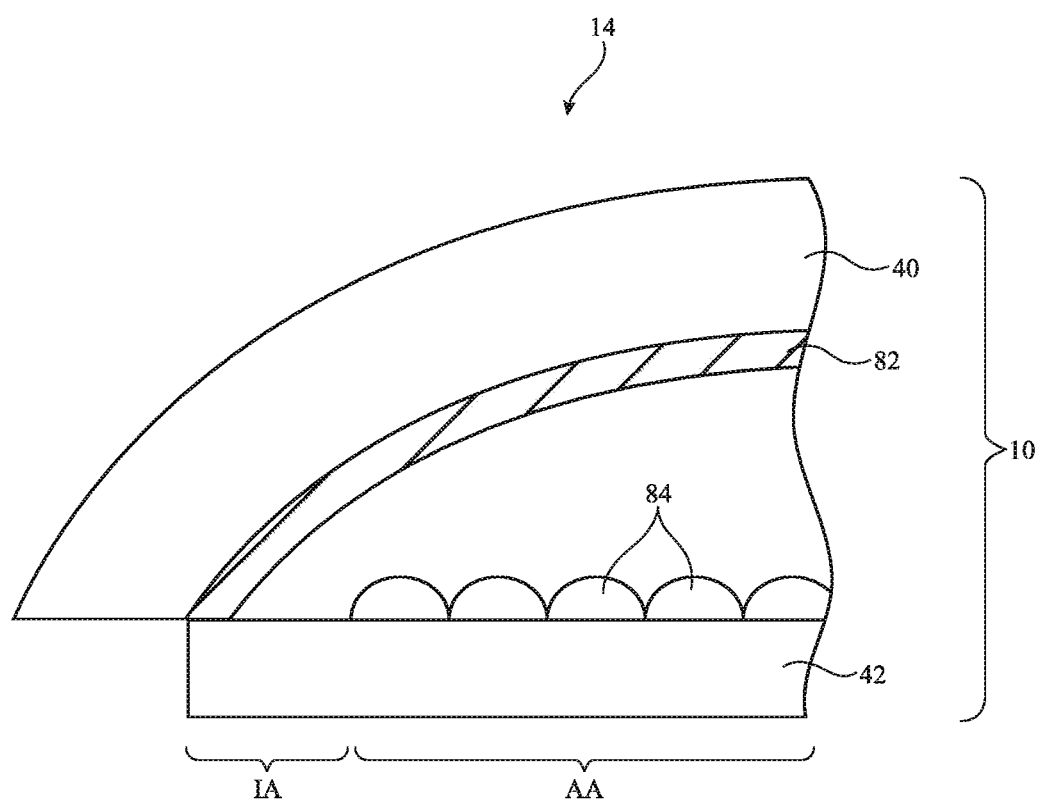
FIG. 9 is a cross-sectional side view of an edge portion of an illustrative electronic device having a display that projects images onto a curved screen under a display cover layer in accordance with an embodiment.

Another illustrative arrangement for display 14 is shown in FIG. 9. As shown by the device 10 of FIG. 9, display 14 may have a display layer 42 with an active area AA (e.g., a portion of display layer 42 containing pixels that display an image for viewing by the user) and an inactive area IA (e.g., an inactive border region that is free of pixels and that contains signal lines and support circuitry). Diffusor layer 82 may be placed against the inner surface of display cover layer 42 along the edges and/or corners of device 10 and/or in the middle of device 10. Layer 82 may be a layer of polymer with light scattering particles (e.g., particles of inorganic material such as high refractive index metal oxides). Lens structures 84 (e.g., microlenses or other lens structures) may direct light from the pixels of active area AA onto layer 82. In this way, an image from display layer 42 may be projected onto layer 82. Layer 82 may be deposited onto portions of layer 40 where the inner surface of layer 40 has a curved surface profile (e.g., compound curvature). The use of lens structures 84 to project image light onto layer 82 therefore allows images to be displayed in corner portions of device 10 and other areas where display cover layer 40 may have curved inner and/or outer surface profiles (e.g., surfaces of compound curvature).

Figure 10:
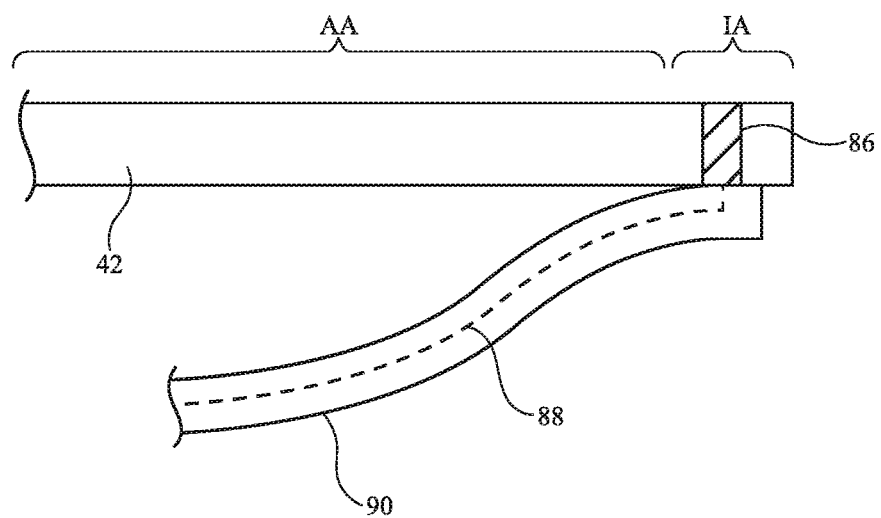
FIG. 10 is a cross-sectional side view of an illustrative display panel showing how through-panel vias may be used to reduce the size of an inactive border region in the display panel in accordance with an embodiment.

To minimize borders in display 14, display layer 42 may have vias such as vias 86 of FIG. 10. Vias 86, which may sometimes be referred to as through-panel vias, may pass through the substrate of display layer 42, so that signal routing lines and other circuitry that might otherwise be located on the top of layer 42 in inactive border area IA may instead be relocated to the lower surface of display layer 42 and/or may be incorporated into an attached flexible printed circuit (see, e.g., routing lines and other display circuitry 88 in flexible printed circuit 90, which is coupled to vias 86 on the inwardly facing surface of display layer 42). By moving circuitry from inactive area IA of display layer 42 to the rear of display layer 42 and/or ancillary flexible printed circuit substrates such as printed circuit 90, the width of inactive area IA and therefore the width of any visible display border for display 14 may be reduced.

Figure 11:
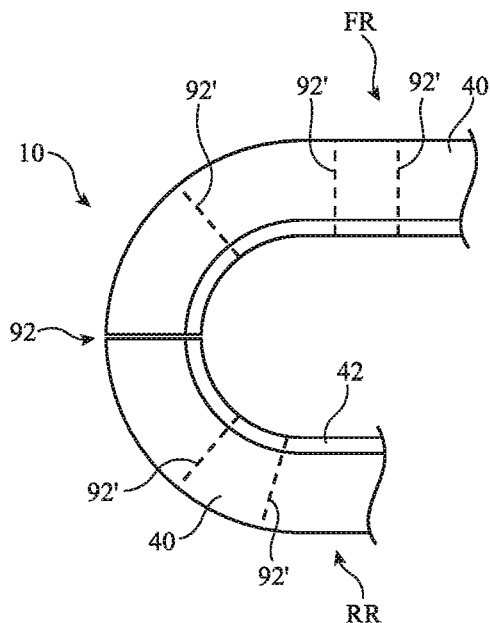
FIG. 11 is a cross-sectional side view of an illustrative electronic device with a curved display cover layer and an associated curved flexible display in accordance with an embodiment.

FIG. 11 is a cross-sectional side view of an edge portion of device 10 showing how multiple pieces of glass, clear polymer, sapphire or other crystalline material, or other transparent material for forming display layer 40 may be joined along one or more seams such as seam 92 (e.g., using adhesive, welds or other joints in which glass, polymer, or other display cover layer material is joined using heat, chemical bonding structures, or other coupling structures). Seam 92 may run around the rectangular periphery of device 10 (e.g., so that seam 92 extends along the upper, left, lower, and right edges of the housing of device 10). In the example of FIG. 11, seam 92 is located midway up the sidewall for device 10. If desired, seam 92 may be located in other portions of display cover layer 40, as shown by illustrative seam locations 92' (e.g., seam 92 may be located at other suitable locations on or near the sidewall of device 10). One or more layers 42 may be mounted to some or all of the inner surface of display cover layer 40. For example, a first layer 42 (e.g., a first organic light-emitting diode display panel) may be mounted to the interior of an upper half of display cover layer 40 and a second layer 42 (e.g., a second organic light-emitting diode display panel) may be mounted to the interior of a lower half of display cover layer 40. One or both of these layers may, if desired, have portions that extend over sidewall portions of the interior of display cover layer 40.

Figure 12:
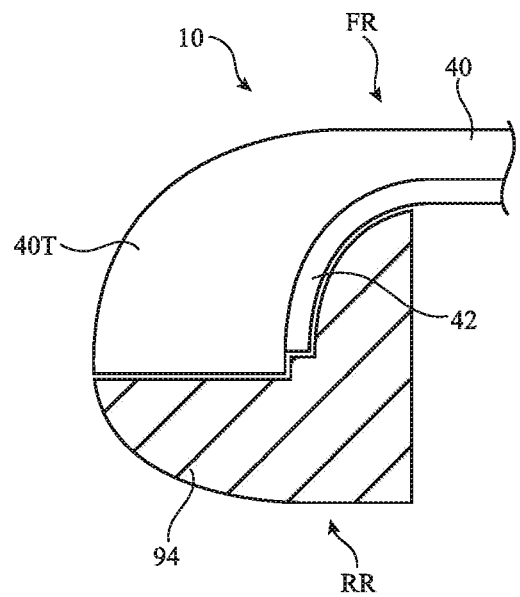
FIG. 12 is a cross-sectional side view of an illustrative flexible display panel mounted under the curved inner surface of a display cover layer that mates with a housing sidewall member in accordance with an embodiment.

FIG. 12 is a cross-sectional side view of an edge portion of device 10 in an illustrative configuration in which the enclosure for device 10 includes a display cover layer with an enlarged edge portion. As shown in FIG. 12, display cover layer 40 may be thinner in portions of display cover layer 40 that cover the central portion of display cover layer 40 than in edge portions of device 10. Along the periphery of device 10, display cover layer 40 may be thickened, as shown by thickened portion 40T of layer 40 of FIG. 12. This may help protect layer 40 from damage during drop events. Display layer 42 may be mounted adjacent to the curved inner surface of display cover layer 40. As shown in FIG. 12, some of the edge of display layer 42 may exhibit a curved profile that matches the curved profile of thickened edge portion 40T of display cover layer 40. The housing of device 10 may be formed entirely of transparent display cover layer material or may, as shown in FIG. 12, include housing structures such as structure 94 that are formed from one or more different materials (e.g., metal, different glass or polymer structures, etc.). Structures such as structure 94 may form some or all of a rear housing wall for device 10 and may have a planar central region that covers rear face RR of device 10. If desired, structures such as structure 94 may be present only along the peripheral edges of device 10 (e.g., structures 94 may form a metal housing band or other peripheral housing member that extends along each of the peripheral edges of device 10). The outermost peripheral surfaces of device 10 of FIG. 12 may have curved profiles as shown in FIG. 12 or may have planar (e.g., vertically oriented) surfaces.

Figure 13:
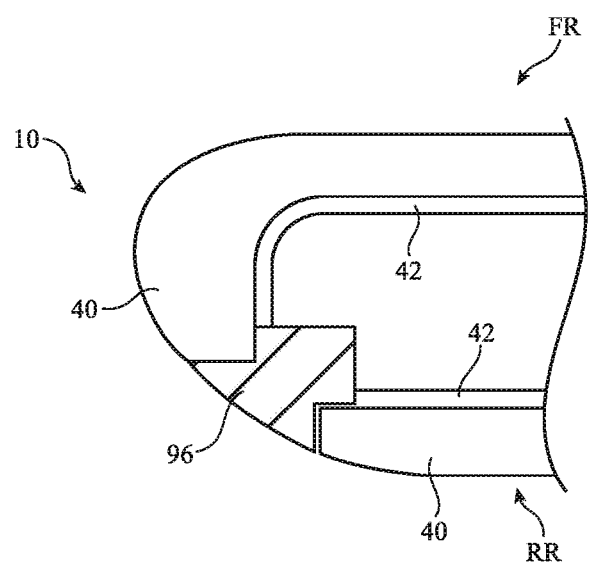
FIG. 13 is a cross-sectional side view of the edge of an illustrative electronic device having a displays on front and rear faces in accordance with an embodiment.

FIG. 13 is a cross-sectional side view of an edge portion of device 10 in an illustrative configuration in which the rear of device 10 is covered with a display cover layer structure (e.g., display cover layer 40 on rear face RR, which covers rear display layer 42). Peripheral housing member 96 may be formed from metal or other materials and may extend along each of the four peripheral edges of device 10 (as an example). Display cover layer 40 may have a portion that covers a display layer 42 on front face FR. Member 96 may be coupled between the front display cover layer structures and the rear display cover layer structures along the periphery of device 10. With this type of arrangement and/or other arrangements in which display layers 42 cover front face FR and rear face RR, images may be displayed for users on both on the front and rear of device 10.

Figure 14:
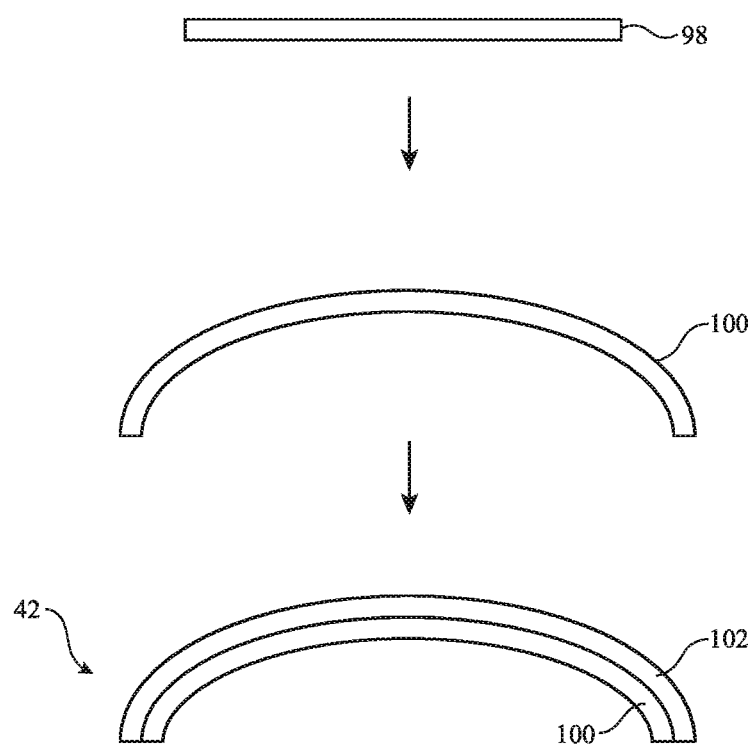
FIG. 14 is a diagram showing illustrative operations involved in forming a display with a curved surface profile in accordance with an embodiment.
Figure 15:
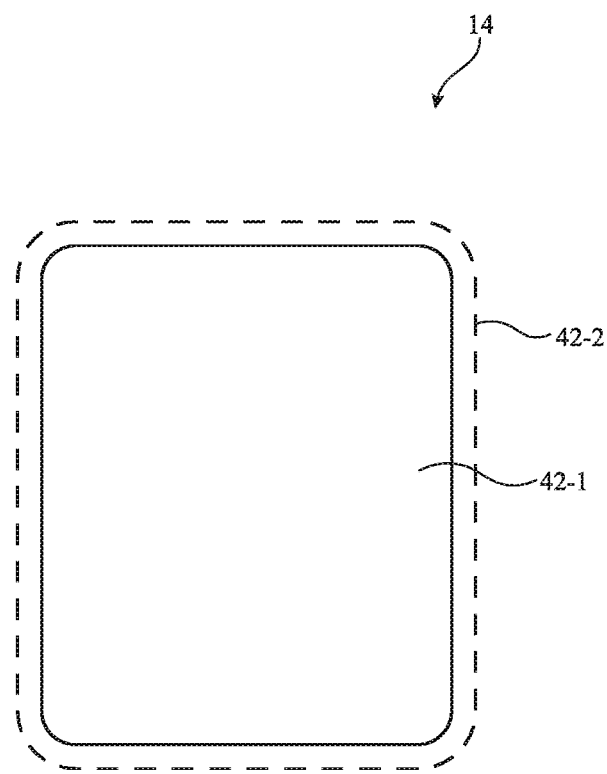
FIG. 15 is a top view of an illustrative electronic device display having a first rectangular portion with rounded corners and a second strip-shaped elongated portion that is wrapped around the periphery of the rectangular portion in accordance with an embodiment.

To avoid damage to flexible display layers (e.g., brittle encapsulation layers and/or sensitive pixel structures), it may be desirable to perform fabrication operations on display layers 42 while some of display layers 42 are in a bent configuration. Consider, as an example, the arrangement of FIG. 14. Initially, display layer 98 (e.g., a substrate and/or other partial portion of display layer 42) may have a planar configuration. Before depositing brittle structures such as inorganic thin-film encapsulation layers and/or pixel layers such as thin-film structures that form an array of organic light-emitting diode pixels for layer 42, layer 98 may be bent into a desired shape (see, e.g., the illustrative shape of layer 100 of FIG. 14, which has been bent into a configuration having surfaces with curved profiles). The edges of layer 100 may be bent and/or the center of layer 100 may be bent. This allows layer 100 to form a shape of the type shown in FIGS. 11, 12, and 13 (as examples). After bending, potentially brittle structures such as thin-film pixel structures and/or thin-film encapsulation (e.g., layer 102) may be deposited (e.g., one or more fabrication tools such as deposition tools that create a vacuum around layer 100 can be used to deposit layer 102). These deposited layers may be formed while layer 100 is in its bent configuration, so that layer 102 will have a curved profile without additional bending. This approach may help avoid creating damage to potentially sensitive structures in display layer 42 during display bending operations.

If desired, display layer 42 may include a first portion such as display layer 42-1 of FIG. that forms a central rectangular portion of display 14 and may include a second portion (e.g., a strip-shaped elongated display layer) such as display layer 42-2 that wraps around the periphery of display 14. This type of arrangement, which uses separate display panels (e.g., separate organic light-emitting diode display panels), avoids situations in which the corners of display 14 are left uncovered by display pixels, because the strip shape of layer 42-2 allows layer 42-2 to be bent around each of the four rounded corners of the rectangular periphery of device 10.

Figure 16:
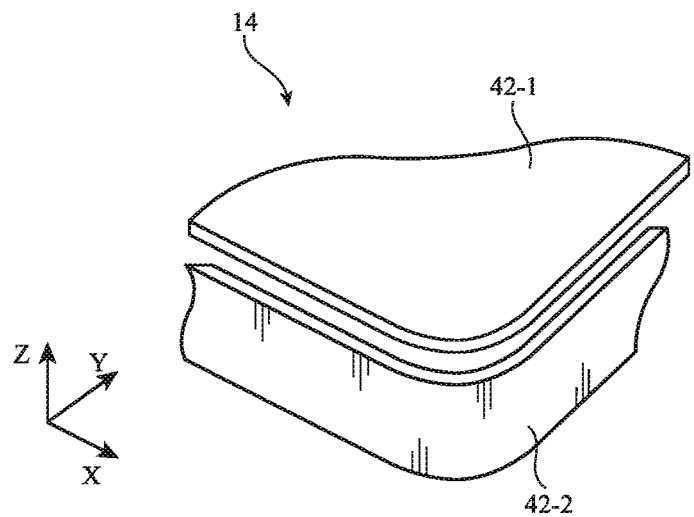
FIG. 16 is a perspective view of an illustrative display with a planar central portion and vertical sidewall portion in accordance with an embodiment.
Figure 17:
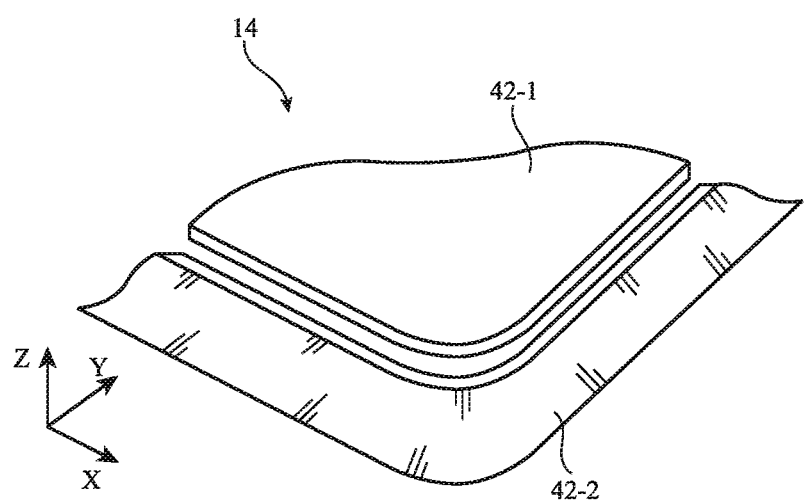
FIG. 17 is a perspective view of an illustrative display with a planar central portion and an angled sidewall portion in accordance with an embodiment.

FIG. 16 is a perspective view of a portion of an illustrative corner of display 14 in device 10 showing how display layer 42-2 may have surfaces that are perpendicular to layer 42-1 (e.g., showing how the surface normals of layer 42-2 are perpendicular to the surface normal of layer 42-1, so that the surfaces of layer 42-2 are vertically oriented). In the example of FIG. 17, elongated strip-shaped layer 42-2 is angled (e.g., the surface normals of layer 42-2 are oriented so that they are not perpendicular to the surface normal of layer 42-1). This type of arrangement may be used to help create sloping upper and/or lower portions of display 14 along the peripheral edges of device 10.

Figure 18:
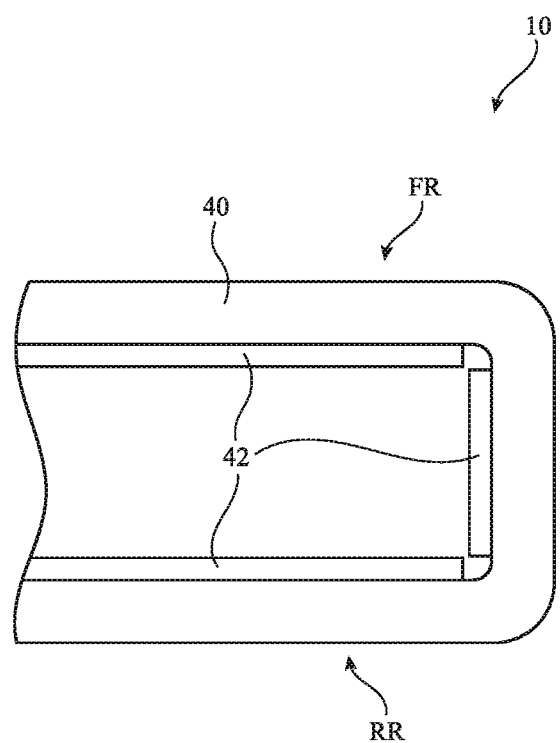
FIG. 18 is a cross-sectional side view of an edge portion of an illustrative electronic device having display layers on a front face, sidewall, and a rear face of a device in accordance with an embodiment.

FIG. 18 is a cross-sectional side view of an edge portion of device 10 in an illustrative configuration in which device 10 has a strip-shaped display layer that wraps around the peripheral edges of device 10 to create a vertical sidewall display portion. Display layers 40 on front face FR and rear face RR of device 10 cover the front and rear of device 10, so that device has displays on most or all exposed surfaces. If desired, the sidewall of display cover layer 40 of FIG. 18 may have a planar inner surface and an outer surface with a curved surface profile.

Figure 19:
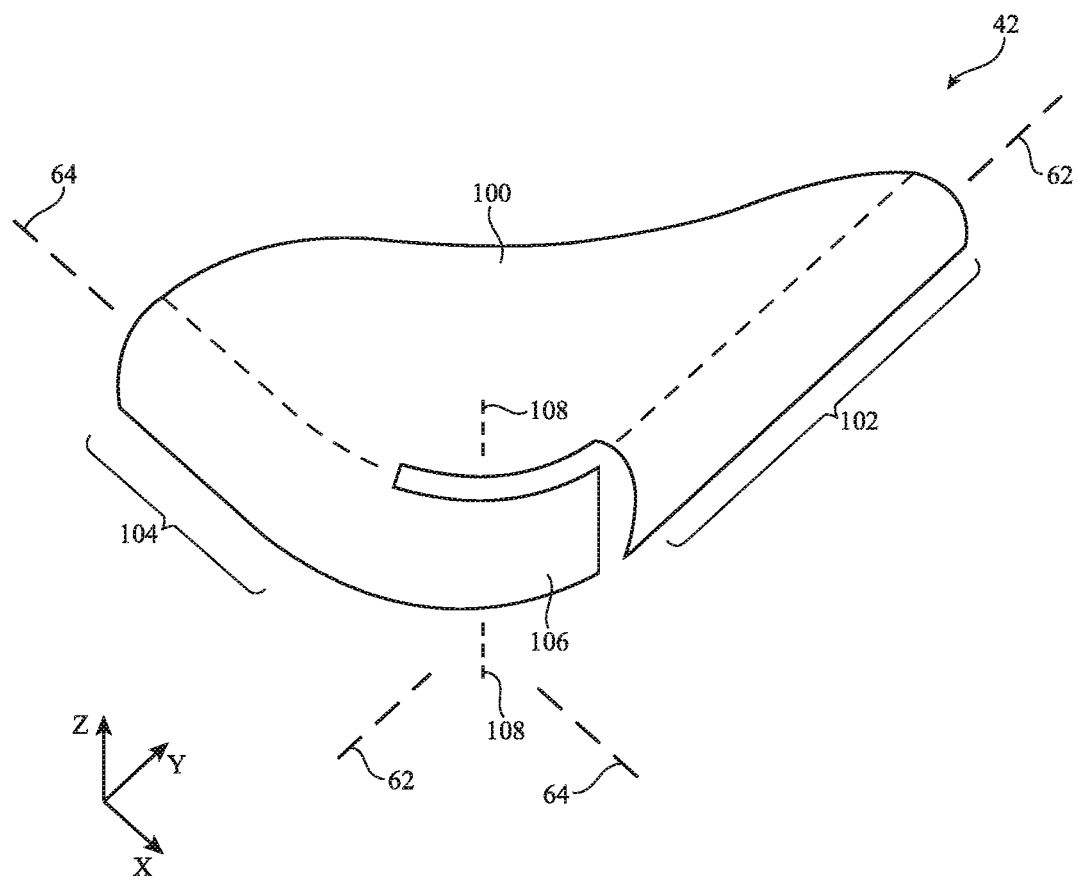
FIG. 19 is a perspective view of an illustrative corner portion of a display with a bent protrusion in accordance with an embodiment.

To accommodate curved structures (e.g., display cover layer sections with curved profiles, compound curvature, etc.), device 10 may have protruding display layer portions (sometimes referred to as tabs or protrusions) that bend about corners or other portions of device Consider, as an example, the illustrative arrangement of FIG. 19. As shown in FIG. 19, display layer 42 may have a central rectangular portion such as portion 100. Elongated side portions of layer 42 may be bent downwardly from the plane of central portion 100. Layer 42 may have one, two, three, or four elongated side protrusions such as illustrative side (edge) protrusions 102 and 104. Each of these elongated protrusions may run along a different respective peripheral edge of device 10. For example, protrusions 104 may run along a first edge of device 10 and may be bent about bend axis 64 and protrusion 102 may run along a second edge of device 10 and may be bent about bend axis 62.

Display cover layer 40 may cover display layer 42 and may include edge portions (e.g., transparent sidewalls) with curved surface profiles that cover protrusions 102 and 104. In the corner of device 10 between portions 104 and 102, display cover layer 40 may have a surface with compound curvature. To help display image content in corner portions of display layer 42 and to accommodate display cover layer surfaces with compound curvature, display layer 42 may be provided with an elongated corner protrusion such as protrusion (tab) 106 in the corner of device 10 and display 14. As shown in FIG. 19, protrusion 106 may be bent about vertical bend axis 108 (e.g., a bend axis that is parallel to the surface normal of planar central display layer portion 100), thereby allowing protrusion 106 to wrap around the corner of device 10. During operation, the pixels of protrusion 106 may help display an image that is being displayed on layer 42.

Figure 20:
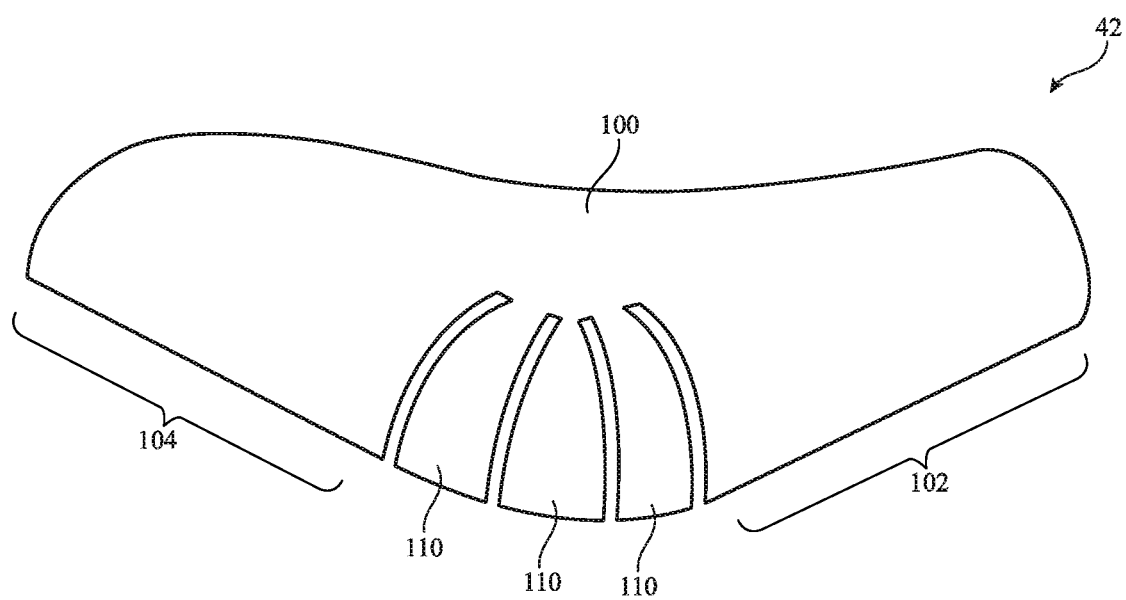
FIGS. 20 and 21 are perspective view of illustrative corner portions of displays with parallel finger-shaped protrusions that extend downwardly to provide the corners of a device with pixels in accordance with embodiments.
Figure 21:
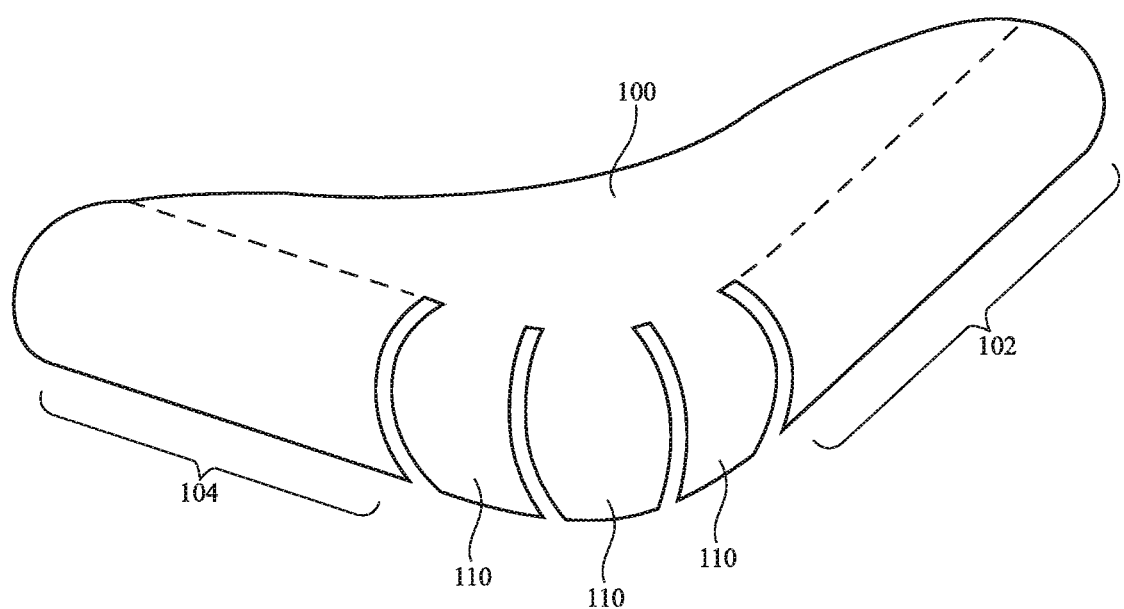

Another illustrative configuration for display layer 42 is shown in FIG. 20. In the example of FIG. 20, portion 100 of display layer 42 has finger-shaped protrusions 110 that protrude in parallel outwardly (and downwardly) from the corner of portion 100 to cover the corner of device 10. The arrangement of FIG. 20 has curved profile sidewall display structures (curved portions 104 and 102) that form quarter cylinders running along the sides of device 10. As shown in FIG. 21, portions 102 and 104 may be bent more to form half cylinders or other display layer shapes along the edges of device 10 (e.g., under transparent curved sidewalls formed from portions of layer 40). In the arrangement of FIG. 21, finger-shaped protrusions 110 have barrel shapes that help accommodate compound curvature at the corner of device 10 when protrusions 110 are bent over the corner of device 10 (e.g., protrusions 110 may be barrel-shaped protrusions, sometimes referred to as barrel-shaped fingers). Each of the corners of device 10 may have 1-10 barrel-shaped fingers, at least two barrel-shaped fingers, at least three barrel-shaped fingers, at least four barrel-shaped fingers, fewer than eight barrel-shaped fingers, or other suitable number of barrel-shaped fingers. The barrel-shaped fingers may run parallel to each other at each corner. If desired, the parallel fingers at each corner may have shapes other than barrel shapes (e.g., the fingers may have rectangular outlines, etc.).

Arrangements of the types shown in FIGS. 19, 20, and 21 have display layers 42 with gaps (sometimes referred to as gaps G) between adjacent display portions. For example, there may be gaps (areas with no pixels) between protruding fingers and adjacent display edges, gaps between elongated corner protrusions and adjacent display layer portions, etc. It may be desirable to minimize the visual impact of such gaps in display layer 42, thereby providing device 10 with an attractive appearance (e.g., configuring display layer 42 so that device 10 appears to have a continuous or nearly continuous display covering its edges, corners, and/or other portions of device 10).

Illustrative structures that may be located in the gaps between different sets of pixels in display layer 42 are shown in FIGS. 22, 23, 24, and 25. These structures, which may sometimes be referred to as gap-filling or gap-overlapping structures, may help create an attractive gap appearance and/or may help hide gaps.

Figure 22:
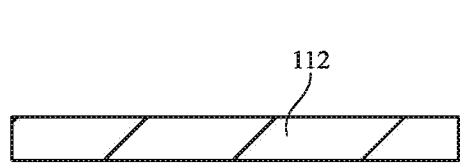
FIG. 22 is a cross-sectional side view of an illustrative layer of ink or other masking material that may overlap a gap or other area in a display in accordance with an embodiment.

In the example of FIG. 22, an illustrative gap-overlapping structure is formed from a layer of material (layer 112). Layer 112 may be a polymer layer or other suitable layer (e.g., a layer of metal, ceramic, glass, polymer, other materials, combinations of these materials, etc.). As an example, layer 112 may be a polymer layer including light-scattering particles (e.g., particles of inorganic material such as titanium oxide that provide layer 112 with a white appearance). If desired, layer 112 may be a polymer layer including dark particles (e.g., dark dye or pigment such as black dye and/or pigment) or may be a polymer layer that includes dye, pigment, or other colorant to provide layer 112 with a non-neutral color. With one illustrative arrangement, layer 112 may be material that hides internal components from view such as an opaque layer of ink or other opaque masking material.

To help obscure gaps in display layer 42, structures such as layer 112 may be formed on the underside of display cover layer 40 in areas that overlap display layer gaps or in other locations that overlap the display layer gaps. The color of layer 112 may be selected to block display layer gaps from view and/or to help blend the appearance of display layer gaps with adjacent portions of display layer 42. Examples of suitable colors for layer 112 include white, black, gray, a non-neutral color such as red, blue, yellow, or any other suitable color.

Figure 23:
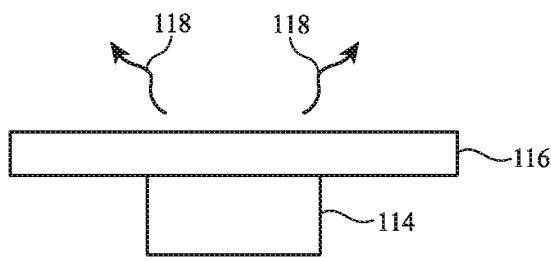
FIG. 23 is a cross-sectional side view of an illustrative light source and diffuser that may overlap a gap or other area in a display in accordance with an embodiment.

In the example of FIG. 23, the gap-overlapping structure is a light-emitting gap-overlapping structure that has been formed from a diffuser structure (e.g., diffuser 116) and a light source such as light source 114. Diffuser 116 may be a planar structure (e.g., diffuser 116 may be a layer of material), may have a three-dimensional shape (e.g., a cube, cube with rounded surfaces, a pyramid, or other suitable shape), may have an elongated strip shape, may form a corner of the housing for device 10, may form an edge of the housing for device 10, may form a peripheral band that extends along the rectangular periphery of the housing of device 10, or may have other suitable shapes. Diffuser 116 may be formed from glass, plastic, or other transparent material. Colorant (e.g., dye or pigment) may be incorporated into diffuser 116 to provide diffuser 116 with a desired appearance (e.g., a neutral or non-neutral tint). Diffuser 116 may incorporated light-scattering particles, voids, textured surfaces, or other light-scattering features to help provide diffuser 116 with a translucent appearance. Light source 114 may emit light into diffuser 116. The emitted light may pass through diffuser 116 and/or may be guided within diffuser 116 in accordance with the principal of total internal reflection (e.g., diffuser 116 or transparent portions of diffuser 116 may serve as a light guide).

Light source 114 may emit light of one or more different colors. For example, light source 114 may include light source components configured to emit red light, blue light, green light, yellow light, white light, etc. Light source 114 may be based on lasers, light-emitting diodes, lamps, etc. Light source 114 may, for example, include a set of multiple crystalline semiconductor light-emitting diodes (e.g., light-emitting diodes that are each formed from a respective crystalline semiconductor die) of different respective colors that can be individually controlled to adjust the color of emitted light from light source 114. Flashing patterns of light can be emitted, if desired. When emitted light from light source 114, light enters diffuser 116 and diffuser 116 diffuses the light to produce diffuse output light 118.

Figure 24:
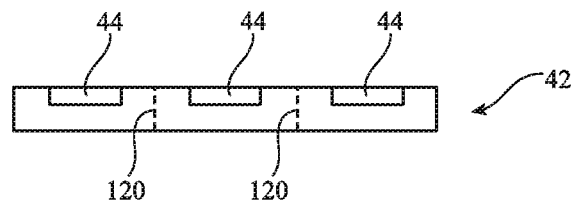
FIG. 24 is a cross-sectional side view of an illustrative display layer with pixels of the type that may overlap a gap or other area in a display in accordance with an embodiment.

FIG. 24 shows how display layer 42 can be provided with openings 120 to enhance display layer flexibility. Layer 42 may be formed from a flexible polymer substrate such as a polyimide substrate. Thin-film structures may be formed on the substrate to form pixels 44 (e.g., an array of organic light-emitting diode pixels). Laser cutting, drilling, or other hole formation techniques may be used to create an array of openings 120 in the flexible polymer substrate to enhance the flexibility (and stretchability) of display layer 42. Once provided with openings 120, display layer 42 may be mounted to a curved inner surface of display cover layer 40 (e.g., a corner portion of layer 40 with compound curvature) and/or can otherwise be mounted in device 10 to serve a part of a display having a region with a curved profile. If desired, flexible display structures such as flexible display layer 42 of FIG. 24 can be mounted in device 10 in positions that overlap gaps between other display layers 42 (e.g., display layer 42 may serve as a gap-overlapping structure). In an illustrative arrangement, an organic light-emitting diode display may have a rectangular central region surrounded by four bent peripheral edges. The corners of device 10 (e.g., corners with compound curvature) can be provided with pixels using a flexible layer such a layer 42 of FIG. 24, thereby ensuring that the pixels of display 14 cover all desired surfaces of device 10. If desired, display layer 42 of FIG. 24 may overlap gaps in a separate organic light-emitting diode display panel.

Figure 25:
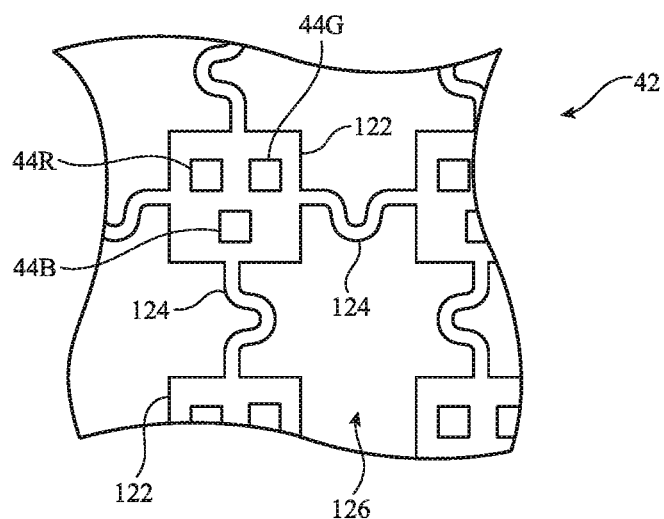
FIG. 25 is a top view of an illustrative display having a pixel array formed on a flexible mesh-shaped substrate in accordance with an embodiment.

Another flexible display structure is shown in FIG. 25. In the example of FIG. 25, display layer 42 has a mesh-shaped substrate. The mesh-shaped substrate may be formed from a polymer material. For example, the mesh-shaped substrate may be formed from an elastomeric polymer such as silicone or other material that can stretch and bend. The mesh-shaped substrate may have regions such as islands 122 that are interconnected by interconnecting lines 124. Lines 124 may have narrow widths and/or meandering shapes to enhance flexibility and may contain metal traces for forming signal lines that interconnect circuitry on islands 122.

Islands 122 and lines 124 may be configured to form an array of openings 126 in the mesh-shaped substrate. Electrical components and circuitry may be mounted on islands 122 and/or lines 124. The electrical components may include sensors such as touch sensors, haptic output devices, other sensors and output devices, light-emitting diodes and other light sources, and/or other electrical components. As an example, the electrical components may include light-emitting diodes (or lasers) such as red light-emitting diode 44R, green light-emitting diode 44G, and/or blue light-emitting diode 44B. The diodes may, if desired, be crystalline semiconductor light-emitting diodes (e.g., diodes formed from crystalline semiconductor light-emitting diode dies).

Each set of diodes in this type of arrangement may form colored pixels (subpixels) for a respective pixel in display layer 42. Because islands 122 and lines 124 are formed from flexible material and/or flexible shapes such as serpentine shapes, display layer 42 can be stretched and bent to accommodate mounting in shapes with curved profiles and/or shapes with compound curvature. For example, display layer 42 can overlap all of the interior surface of display cover layer 40, may overlap edge portions of display cover layer 40 (e.g., portions of layer 40 with curved surface profiles), may overlap corner portions of display cover layer 40 (e.g., corner surfaces with compound curvature), may cover gaps in a display layer such as an organic light-emitting diode display layer, and/or may otherwise be incorporated into display 14.

Figure 26:
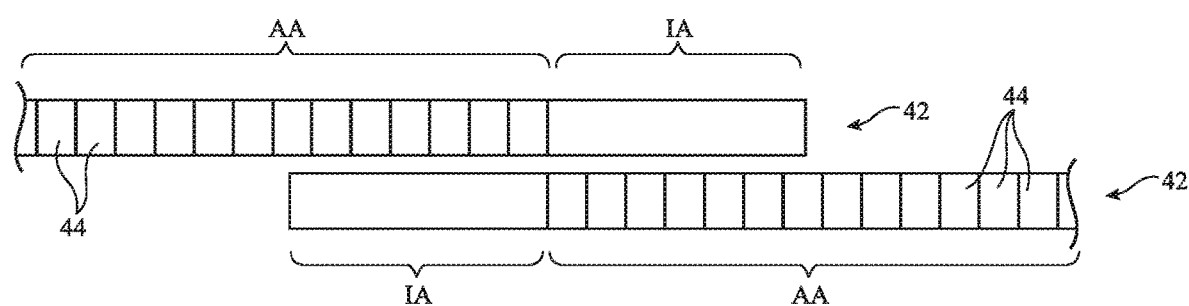
FIG. 26 is a cross-sectional side view of an illustrative display formed from overlapping display panels in accordance with an embodiment.

If desired, gaps in display layer 42 can be reduced or eliminated in arrangements in which adjacent portions of display layer 42 overlap each other. This type of arrangement is shown in FIG. 26. As shown in FIG. 26, first and second display layers 42 may have respective arrays of pixels 44 (forming respective active areas AA that are configured to display images for a user) and respective inactive border areas IA. Border areas IA are free of pixels, but may contain metal traces, display driver circuitry, and other display circuitry (e.g., display circuitry without pixels). By creating spaces within the circuitry and electrical components of inactive areas IA, inactive areas IA may be configured to be at least partially transparent to light (e.g., areas IA may exhibit light transmission values of at least 30%, at least 60%, at least 90%, less than 99%, or other suitable transmission values). As shown in FIG. 26, this allows the edge of active area AA in a lower of two display layers 42 to be aligned with and overlapped by the transparent inactive area IA of an upper of two display layers 42. When viewed from above, display 14 will appear to be continuous to a viewer (e.g., there will be no visible space between adjacent active areas AA). Display layers 42 of FIG. 26 may overlap in a corner of device 10 (e.g., where fingers of display layer 40 wrap around a surface of compound curvature), may overlap curved edge surfaces, or may be formed elsewhere in device 10. The overlapping display panel edges of FIG. 26 may be part of a common display panel (e.g., a common display substrate) or may be formed from separate overlapping display panels (e.g., separate display substrates).

Figure 27:
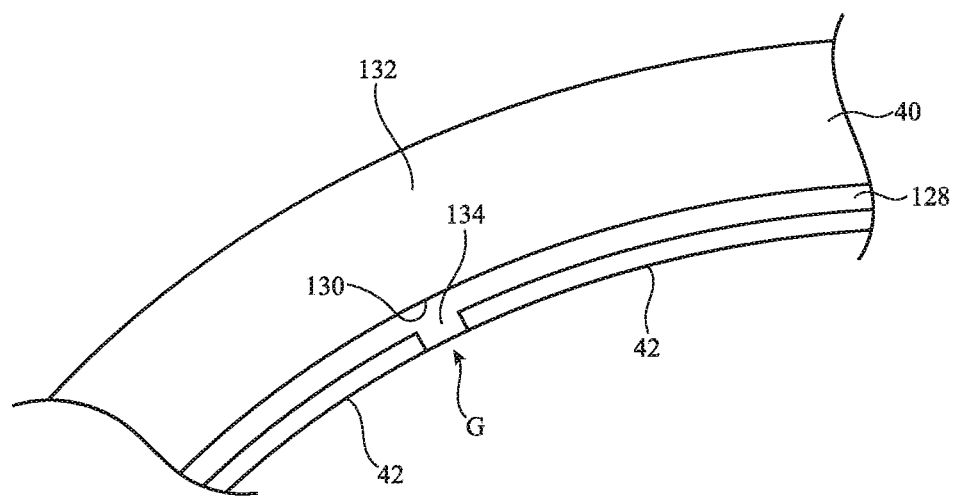
FIG. 27 is a cross-sectional side view of an illustrative portion of a display cover layer with a light scattering region that is overlapping a gap between two sets of pixels in accordance with an embodiment.

FIG. 27 shows how display cover layer 40 may have a region such as region 132 that is overlaps gap G in display layer 42. To help hide gap G, region 132 may be selectively provided with light-scattering features (e.g., particles, laser-damaged glass or polymer, or other diffusive structures that create a light diffusing structure in region 132). If desired, lower surface 130 of display layer 40 may be textured in the portion of surface 130 that overlaps gap G. Using textured surfaces, embedded particles, or other light-scattering features, colorant in selected portions of layer 40, and/or other structures in layer 40, a portion of layer 40 can be provided with a gap-filling appearance and can serve as a gap-overlapping structure to help visually obscure gap G. For example, in arrangements in which portion 132 and/or surface 130 over gap G are configured to diffuse light, it may be difficult or impossible to view gap G through layer 40. If desired, portion 134 of layer 128 (e.g., a polymer layer serving as an adhesive) may be provided with embedded particles, colorant, bubbles or other voids, texture, and/or other structures that help layer 128 diffuse light and thereby help obscure gap G from view from the exterior of device 10.

Figure 28:
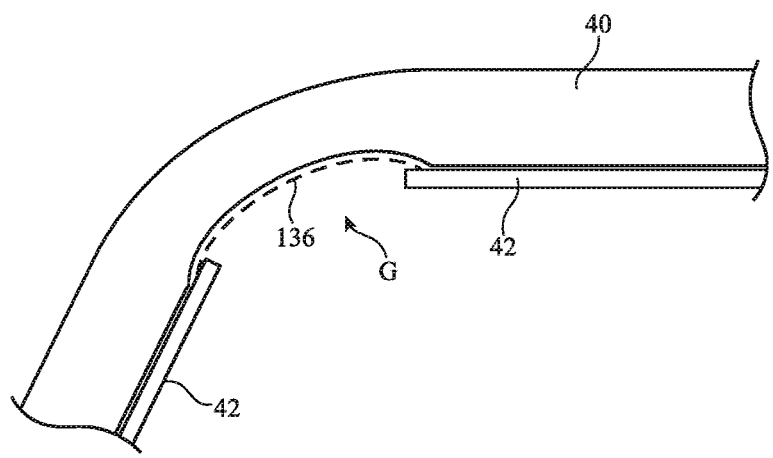
FIG. 28 is a cross-sectional side view of an illustrative display cover layer and associated gap-overlapping structures that are overlapping a gap between two sets of pixels in accordance with an embodiment.

In the illustrative arrangement of FIG. 28, gap G between planar display layers 42 may be covered with gap-overlapping structure 136. Structure 136 may be an ink layer or other layer of material that hides or visually enhances the appearance of gap G (see, e.g., layer 112 of FIG. 22), may be a diffuser such as diffuser 116 of FIG. 23 that is optionally illuminated with a light-emitting device such as an array of light-emitting diodes (see, e.g., light source 114 of FIG. 23), may be a flexible display (e.g., a display with a flexible polyimide substrate or other flexible polymer layer with openings that has been formed into a shape suitable to conform to the curvature of gap G of FIG. 28 such as layer 42 of FIG. 24), may be an elastomeric mesh-shaped flexible display such as mesh-shaped display layer 42 of FIG. 25, or may be other suitable gap-overlapping structure for covering gap G. Display layers 42 of FIG. 28 may be planar and may be mounted on corresponding planar inner surfaces of display cover layer 40 (e.g., with an optional layer of interposed adhesive) or may have surfaces with curved profiles (e.g., surfaces with compound curvature).

Figure 29:
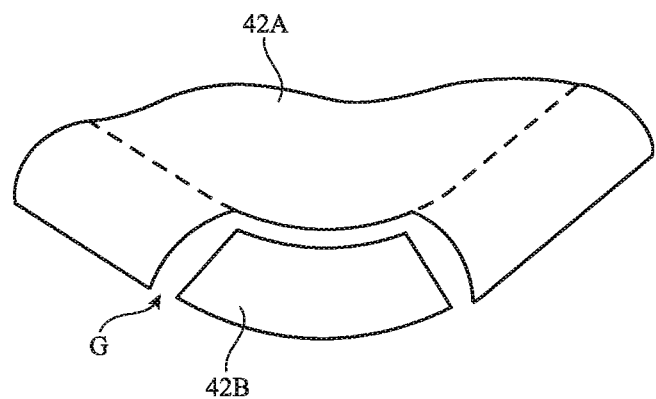
FIG. 29 is a perspective view of an illustrative corner portion of a display layer having a first display panel with bent edge tabs and a second display panel that fills an area at the corner of the first panel in accordance with an embodiment.

FIG. 29 is a perspective view of an illustrative corner of display 14 for device 10. In the example of FIG. 29, gap G is formed between a first display layer 42A that has a planar (or slightly curved) central rectangular portion surrounded by four bent elongated strip-shaped protrusions along four respective edges of the rectangular portion and a second display layer 42B that is bent around a corner portion of device 10 (e.g., a corner portion with compound curvature). Gap-overlapping structures such as structures 136 of FIG. 28 may overlap gap G of FIG. 29 at one corner, two corners, three corners, or four corners of the housing of device 10 (as examples).

Figure 30:
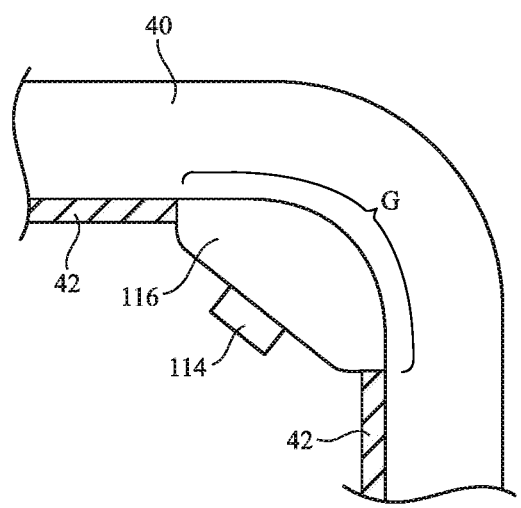
FIG. 30 is a cross-sectional view of an illustrative corner portion of a display formed from multiple display panels in accordance with an embodiment.

FIG. 30 is a diagram of an illustrative corner portion of device 10 in a configuration in which a gap-overlapping structure such as the structure of FIG. 23 has been mounted under an inner surface of display cover layer 20 with a curved profile (e.g., a surface of compound curvature). Diffuser 116 may overlap gap G between portions of display layer 42 that extend along respective edges of device 10. The curvature (e.g., compound curvature) of the outer surface of diffuser 116 may match the curvature of the opposing (mating) inner surface of display cover layer 40 in the corner of device 10. Light source 114 (e.g., one or more independently adjustable colored light-emitting diodes of different colors, etc.) may be used to illuminate diffuser 116. If desired, diffuser 116 may extend in a ring around most or all of the rectangular perimeter of device 10 (e.g., to serve as an edge-lit waveguide with light-scattering structures and/or other diffusor structure that provides a curved sidewall portion of device 10 with an illuminated appearance). The use of diffuser 116 to fill gaps G at the corners of device 10 is illustrative.

Figure 31:
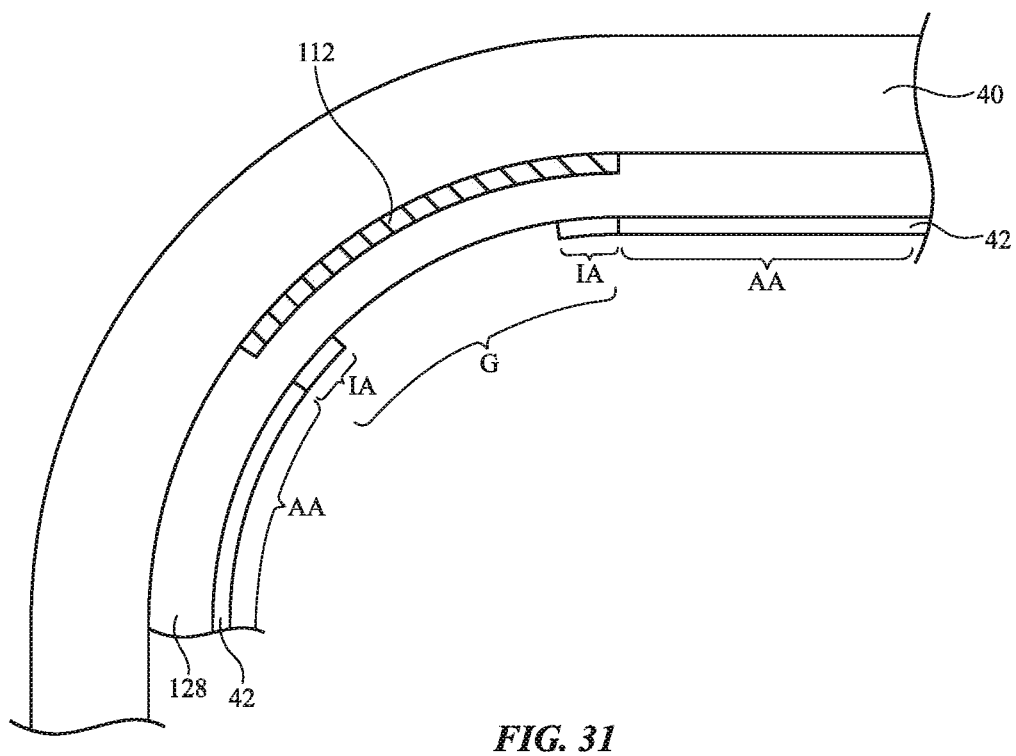
FIG. 31 is a cross-sectional side view of an illustrative electronic device edge portion showing how a gap between display layer portions associated with a single display panel or separate display panels can be covered using opaque masking material on an inner surface of a display cover layer in accordance with an embodiment.

Another illustrative arrangement for device 10 is shown in FIG. 31. In the example of FIG. 31, first and second portions of display layer 42 (e.g., portions of a common display panel or two separate display panels) are formed on opposing sides of gap G. Inactive border portions of layers 42 may extend into gap G. Layer 128 (e.g., a polymer layer) may be used in attaching layer(s) 42 to the inner surface of display cover layer 40. Layer 40 may, for example, have an inner surface with a curved profile (e.g., a surface with compound curvature). Layer 112 (e.g., an opaque layer of polymer or other material such as layer 112 of FIG. 112) may overlap gap G and thereby hide inactive areas IA of display layer 42 and other structures in gap G.

Gap-overlapping structures may have any suitable size and shape and may overlap and cover gaps G of any suitable size and shape. As an example, the gap-overlapping structures and gaps G may have straight and/or curved sides and may have lateral dimensions of at least 0.05 mm, at least 0.1 mm, at least 0.4 mm, at least 0.8 mm, at least 1.2 mm, less than 10 mm, less than 2 mm, less than 1 mm, less than 0.3 mm, less than 0.2 mm, or other suitable size.

In arrangements in which gaps G are covered by structures that emit light (e.g., arrays of pixels, a set of one, two, three, or more light-emitting diodes such as crystalline semiconductor light-emitting diodes, etc.), the properties of the emitted light (color, intensity, output duration, pulse width, pulse pattern, output light location, etc.) can be adjusted to provide a user with a desired device appearance, to supply a user with a notification (e.g., an alarm notification, an incoming message notification, etc.). Light-emitting gap overlapping structures may also serve as indicators for battery strength, wireless signal strength, operating mode (e.g., airplane mode, handsfree mode, etc.).

The foregoing is merely illustrative and various modifications can be made to the described embodiments. The foregoing embodiments may be implemented individually or in any combination.

What is claimed is:

1. An electronic device, comprising:
    a display having a planar array of pixels in an active area configured to display images and having an inactive area;
    a plurality of microlenses that overlaps the planar array of the pixels; and
    a display cover layer that overlaps the plurality of microlenses, wherein the plurality of microlenses overlaps the active area without overlapping the inactive area.

2. The electronic device defined in claim 1 further comprising:
    a diffusor layer interposed between the plurality of microlenses and the display cover layer.

3. The electronic device defined in claim 2 wherein the diffusor layer overlaps the active and inactive areas.

4. The electronic device defined in claim 2 wherein the display cover layer has a curved portion and wherein the diffusor layer overlaps the curved portion.

5. An electronic device having a front, a rear, and sides that extend between the front and the rear, comprising:
    a first glass portion that faces the front;
    a first array of pixels configured to display images through the first glass portion;
    a second glass portion that faces one of the sides;
    a second array of pixels configured to display images through the second glass portion;
    a third glass portion that faces the rear; and
    a third array of pixels configured to display images through the third glass portion.

6. The electronic device defined in claim 5 wherein the first glass portion and the second glass portion are planar and are coupled by a curved glass portion.

7. The electronic device defined in claim 6 wherein the third glass portion is planar and is coupled to the second glass portion with an additional curved glass portion.

8. An electronic device, comprising:
    a display cover layer having an outline with a corner surface of compound curvature;
    a display layer overlapped by the display cover layer, wherein the display layer has pixels configured to display images and has a gap that separates a first array of the pixels that are configured to display a first image from a second array of the pixels that are configured to display a second image; and
    a gap-overlapping structure configured to overlap the gap.

9. The electronic device defined in claim 8 wherein the gap-overlapping structure includes a light-emitting device, the electronic device further comprising cellular telephone transceiver circuitry, wherein the gap is overlapped by the corner surface of the compound curvature, wherein the gap-overlapping structure comprises a diffuser having a surface of the compound curvature, and wherein the light-emitting device comprises a crystalline semiconductor light-emitting diode configured to emit light through the diffuser and the gap.

10. The electronic device defined in claim 8 wherein the gap-overlapping structure includes a light-emitting device, wherein the gap is overlapped by the corner surface of the compound curvature and wherein the light-emitting device comprises a crystalline semiconductor light-emitting diode configured to emit light through the gap.

11. The electronic device defined in claim 10 further comprising a flexible substrate on which the crystalline semiconductor light-emitting diode is mounted.

12. The electronic device defined in claim 11 wherein the flexible substrate comprises a mesh-shaped elastomeric polymer.

13. The electronic device defined in claim 8 wherein the gap-overlapping structure includes a light-emitting device and wherein the light-emitting device comprises crystalline semiconductor light-emitting diodes of different colors.

14. The electronic device defined in claim 8 wherein the display cover layer has a light diffusing portion overlapping the gap.

15. The electronic device defined in claim 8 further comprising a transparent layer that is interposed between the display cover layer and the display layer, wherein the transparent layer has a light diffusing portion overlapping the gap.

16. The electronic device defined in claim 8 wherein the gap-overlapping structure is a layer comprising a material selected from the group consisting of: ink, metal, ceramic, glass, and polymer.

17. An electronic device having opposing front and rear faces, comprising:
- a display cover layer having a surface that forms the front face and having a transparent sidewall portion with a curved surface profile that extends along a peripheral portion of the display cover layer;
- a display layer with pixels that is overlapped by the display cover layer, wherein the display layer comprises a display panel having a gap; and
- a gap-overlapping structure that overlaps the gap in the display panel.

18. The electronic device defined in claim 17 wherein the gap-overlapping structure is a crystalline semiconductor light-emitting diode, the electronic device further comprising a diffuser interposed between the display cover layer and the crystalline semiconductor light-emitting diode.

19. The electronic device defined in claim 17 further comprising cellular telephone transceiver circuitry, wherein the display layer comprises an organic light-emitting diode display panel having the gap and wherein the gap-overlapping structure is a crystalline semiconductor light-emitting diode that is configured to emit light through the gap.

20. The electronic device defined in claim 19 wherein the display cover layer has a corner with a surface of compound curvature and wherein the crystalline semiconductor light-emitting diode is configured to emit light through the surface of the compound curvature.

21. An electronic device, comprising:
- a housing;
- a display cover layer with rounded corners coupled to the housing; and
- a flexible display layer having pixels configured to display an image, wherein the display cover layer overlaps the flexible display layer, and wherein portions of the flexible display layer overlap the rounded corners of the display cover layer.

22. The electronic device defined in claim 21 wherein the portions of the flexible display layer include protrusions that comprise barrel-shaped fingers.

23. The electronic device defined in claim 21 wherein each of the surfaces of compound curvature overlaps at least three of the portions.

24. The electronic device defined in claim 21 wherein the portions comprise at least two parallel finger-shaped protrusions at each of the rounded corners.

25. The electronic device defined in claim 21 wherein the portions include first and second protrusions separated by a gap, wherein the electronic device comprises a light-emitting device configured to emit light through the gap, and wherein the light-emitting device comprises first and second crystalline semiconductor light-emitting diodes configured to emit light of first and second different respective colors, the electronic device further comprising:
- a light-diffusing structure overlapping the light-emitting device, wherein the light-diffusing structure comprises a diffuser having a surface with compound curvature.

26. The electronic device defined in claim 21 wherein the portions include first and second protrusions separated by a gap and wherein the electronic device comprises a gap-overlapping structure.

27. The electronic device defined in claim 26 wherein the gap-overlapping structure comprises a light-emitting device and a light-diffusing structure overlapping the light-emitting device, and wherein the light-emitting device is configured to emit light through the light-diffusing structure and the gap.

* * * * *